(12) United States Patent
Brar et al.

(10) Patent No.: US 7,838,905 B2
(45) Date of Patent: Nov. 23, 2010

(54) SEMICONDUCTOR DEVICE HAVING MULTIPLE LATERAL CHANNELS AND METHOD OF FORMING THE SAME

(75) Inventors: Berinder P. S. Brar, Newbury Park, CA (US); Wonill Ha, Thousand Oaks, CA (US)

(73) Assignee: Flextronics International USA, Inc., San Jose, CA (US)

( * ) Notice: Subject to any disclaimer, the term of this patent is extended or adjusted under 35 U.S.C. 154(b) by 315 days.

(21) Appl. No.: 12/034,746

(22) Filed: Feb. 21, 2008

(65) Prior Publication Data

US 2008/0157060 A1 Jul. 3, 2008

Related U.S. Application Data

(63) Continuation of application No. 11/128,623, filed on May 13, 2005, now Pat. No. 7,339,208.

(51) Int. Cl.
*H01L 31/0328* (2006.01)
(52) U.S. Cl. .................. 257/194; 257/192
(58) Field of Classification Search .......... 257/192, 257/194
See application file for complete search history.

(56) References Cited

U.S. PATENT DOCUMENTS

| | | | |
|---|---|---|---|
| 4,499,481 A | 2/1985 | Greene | |
| 4,570,174 A | 2/1986 | Huang et al. | |
| 4,636,823 A | 1/1987 | Margalit et al. | |
| 4,807,022 A | 2/1989 | Kazior et al. | |
| 4,903,089 A | 2/1990 | Hollis et al. | |
| 4,903,189 A | 2/1990 | Ngo et al. | |
| 4,967,243 A | 10/1990 | Baliga et al. | |
| 5,055,889 A | 10/1991 | Beall | |
| 5,068,756 A | 11/1991 | Morris et al. | |
| 5,106,778 A | 4/1992 | Hollis et al. | |
| 5,126,701 A * | 6/1992 | Adlerstein | 333/17.2 |

(Continued)

FOREIGN PATENT DOCUMENTS

EP 1 256 985 A2 11/2002

(Continued)

OTHER PUBLICATIONS

Ajit, J.S., "Design of MOS-Gated Bipolar Transistors with Integral Antiparallel Diode," IEEE Electron Device Letters, pp. 344-347, Jul. 1996, vol. 17, No. 7, IEEE, Los Alamitos, CA.

(Continued)

*Primary Examiner*—Thomas L Dickey
(74) *Attorney, Agent, or Firm*—Slater & Matsil, L.L.P.

(57) ABSTRACT

A semiconductor device having multiple lateral channels with contacts on opposing surfaces thereof and a method of forming the same. In one embodiment, the semiconductor device includes a conductive substrate having a first contact covering a substantial portion of a bottom surface thereof. The semiconductor device also includes a first lateral channel above the conductive substrate and a second lateral channel above the first lateral channel. The semiconductor device further includes a second contact above the second lateral channel. The semiconductor device still further includes an interconnect that connects the first and second lateral channels to the conductive substrate operable to provide a low resistance coupling between the first contact and the first and second lateral channels.

40 Claims, 17 Drawing Sheets

U.S. PATENT DOCUMENTS

| | | | |
|---|---|---|---|
| 5,126,714 | A | 6/1992 | Johnson |
| 5,223,449 | A | 6/1993 | Morris et al. |
| 5,231,037 | A | 7/1993 | Yuan et al. |
| 5,244,829 | A | 9/1993 | Kim |
| 5,292,686 | A | 3/1994 | Riley et al. |
| 5,342,795 | A | 8/1994 | Yuan et al. |
| 5,343,071 | A * | 8/1994 | Kazior et al. .............. 257/621 |
| 5,369,042 | A | 11/1994 | Morris et al. |
| 5,374,887 | A | 12/1994 | Drobnik |
| 5,407,842 | A | 4/1995 | Morris et al. |
| 5,468,661 | A | 11/1995 | Yuan et al. |
| 5,554,561 | A | 9/1996 | Plumton |
| 5,555,494 | A | 9/1996 | Morris |
| 5,610,085 | A | 3/1997 | Yuan et al. |
| 5,624,860 | A | 4/1997 | Plumton et al. |
| 5,700,703 | A | 12/1997 | Huang et al. |
| 5,712,189 | A | 1/1998 | Plumton et al. |
| 5,747,842 | A | 5/1998 | Plumton |
| 5,756,375 | A | 5/1998 | Celii et al. |
| 5,783,984 | A | 7/1998 | Keuneke |
| 5,784,266 | A | 7/1998 | Chen |
| 5,804,943 | A | 9/1998 | Kollman et al. |
| 5,889,298 | A | 3/1999 | Plumton et al. |
| 5,909,110 | A | 6/1999 | Yuan et al. |
| 5,910,665 | A | 6/1999 | Plumton et al. |
| 5,920,475 | A | 7/1999 | Boylan et al. |
| 5,933,717 | A | 8/1999 | Hause et al. |
| 5,956,245 | A | 9/1999 | Rozman |
| 5,956,578 | A | 9/1999 | Weitzel et al. |
| 6,008,519 | A | 12/1999 | Yuan et al. |
| 6,038,154 | A | 3/2000 | Boylan et al. |
| 6,094,038 | A | 7/2000 | Lethellier |
| 6,097,046 | A | 8/2000 | Plumton |
| 6,156,611 | A | 12/2000 | Lan et al. |
| 6,181,231 | B1 | 1/2001 | Bartilson |
| 6,191,964 | B1 | 2/2001 | Boylan et al. |
| 6,208,535 | B1 | 3/2001 | Parks |
| 6,218,891 | B1 | 4/2001 | Lotfi et al. |
| 6,229,197 | B1 | 5/2001 | Plumton et al. |
| 6,287,908 | B1 | 9/2001 | Brand |
| 6,309,918 | B1 | 10/2001 | Huang et al. |
| 6,323,090 | B1 | 11/2001 | Zommer |
| 6,348,848 | B1 | 2/2002 | Herbert |
| 6,362,986 | B1 | 3/2002 | Schultz et al. |
| 6,477,065 | B2 | 11/2002 | Parks |
| 6,483,724 | B1 | 11/2002 | Blair et al. |
| 6,525,603 | B1 | 2/2003 | Morgan |
| 6,549,436 | B1 | 4/2003 | Sun |
| 6,661,276 | B1 | 12/2003 | Chang |
| 6,741,099 | B1 | 5/2004 | Krugly |
| 6,775,159 | B2 | 8/2004 | Webb et al. |
| 6,873,237 | B2 | 3/2005 | Chandrasekaran et al. |
| 6,980,077 | B1 | 12/2005 | Chandrasekaran et al. |
| 7,012,414 | B1 | 3/2006 | Mehrotra et al. |
| 7,046,523 | B2 | 5/2006 | Sun et al. |
| 7,176,662 | B2 | 2/2007 | Chandrasekaran |
| 7,285,807 | B2 | 10/2007 | Brar et al. |
| 7,321,283 | B2 | 1/2008 | Mehrotra et al. |
| 7,417,266 | B1 | 8/2008 | Li et al. |
| 7,439,556 | B2 | 10/2008 | Brar et al. |
| 7,439,557 | B2 | 10/2008 | Brar et al. |
| 7,462,891 | B2 | 12/2008 | Brar et al. |
| 7,504,673 | B2 | 3/2009 | Sadaka et al. |
| 2002/0121647 | A1 | 9/2002 | Taylor |
| 2003/0141518 | A1 | 7/2003 | Yokogawa et al. |
| 2003/0198067 | A1 | 10/2003 | Sun et al. |
| 2003/0203583 | A1 | 10/2003 | Malik |
| 2005/0001235 | A1 | 1/2005 | Murata et al. |
| 2005/0024179 | A1 | 2/2005 | Chandrasekaran et al. |
| 2005/0104080 | A1 | 5/2005 | Ichihara et al. |
| 2006/0038650 | A1 | 2/2006 | Mehrotra et al. |
| 2006/0091430 | A1 | 5/2006 | Sriram et al. |
| 2006/0118824 | A1 | 6/2006 | Otsuka et al. |
| 2006/0187684 | A1 | 8/2006 | Chandrasekaran et al. |
| 2006/0197510 | A1 | 9/2006 | Chandrasekaran |
| 2006/0198173 | A1 | 9/2006 | Rozman |
| 2006/0202299 | A1 | 9/2006 | Chertouk |
| 2006/0208279 | A1 * | 9/2006 | Robinson et al. ............. 257/194 |
| 2006/0226477 | A1 | 10/2006 | Brar et al. |
| 2006/0226478 | A1 | 10/2006 | Brar et al. |
| 2007/0007579 | A1 | 1/2007 | Scheuerlein et al. |
| 2007/0045765 | A1 | 3/2007 | Brar et al. |
| 2007/0069286 | A1 | 3/2007 | Brar et al. |
| 2007/0145417 | A1 | 6/2007 | Brar et al. |
| 2007/0187717 | A1 | 8/2007 | Sadaka et al. |
| 2007/0296028 | A1 | 12/2007 | Brar et al. |
| 2007/0298559 | A1 | 12/2007 | Brar et al. |
| 2007/0298564 | A1 | 12/2007 | Brar et al. |
| 2008/0048173 | A1 | 2/2008 | Sadaka et al. |
| 2008/0048174 | A1 | 2/2008 | Sadaka et al. |
| 2008/0048219 | A1 | 2/2008 | Brar et al. |
| 2008/0054304 | A1 | 3/2008 | Sadaka et al. |

FOREIGN PATENT DOCUMENTS

| | | |
|---|---|---|
| EP | 1 638 147 A2 | 3/2006 |
| WO | WO 2005/015642 A1 | 2/2005 |
| WO | WO 2005015642 A1 * | 2/2005 |

OTHER PUBLICATIONS

Asano, K., et al., "Novel High Power AlGaAs/GaAs HFET with a Field-Modulating Plate Operated at 35V Drain Voltage," IEDM 98, 1998, pp. 59-62, IEEE, Los Alamitos, CA.

Berroth, M., et al., "Extreme Low Power 1:4 Demultiplexer Using Double Delta Doped Quantum Well GaAs/AlGaAs Transistors," Japanese Journal of Applied Physics, Extended Abstracts of the 22nd 1990 International Conference on Solid State Devices and Materials, 1990, pp. 75-78, Tokyo, Japan.

Eisenbeiser, K., et al., "Manufacturable GaAs VFET for Power Switching Applications," IEEE Electron Device Letters, Apr. 2000, pp. 144-145, vol. 21, No. 4, IEEE, Los Alamitos, CA.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE, Los Alamitos, CA.

Lan, E., et al., "A Field Plate Device by Self-Aligned Spacer Process," The International Conference on Compound Semiconductor Manufacturing Technology, 2004, pp. 35-38, GaAs Mantech, St. Louis, MO.

Liu, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE, Los Alamitos, CA.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

Plumton, D.L., et al., "A Low On-Resistance High-Current GaAs Power VFET," IEEE Electron Device Letters, Apr. 1995, pp. 142-144, vol. 16, No. 4, IEEE, Los Alamitos, CA.

Sickmiller, M., "Packaging of Ultrathin Semiconductor Devices Through the ELO Packaging Process," Mat. Res. Soc. Symp. Proc., 2001, pp. I7.3.1-I7.3.6, vol. 681E, Materials Research Society, Warrendale, PA.

Storm, D.F., et al., "Reduction of Buffer Layer Conduction Near Plasma-Assisted Molecular-Beam Epitaxy Grown GaN/AlN Interfaces by Beryllium Doping," Applied Physics Letters, Nov. 11, 2002, pp. 3819-3821, vol. 81, No. 20, American Institute of Physics, Melville, NY.

Tkachenko, Y., et al., "Improved Breakdown Voltage and Hot-Electron Reliability PHEMT for High Efficiency Power Amplifiers," Asia Pacific Microwave Conference (AMPC'99), Nov. 30, 1999, pp. 618-621, vol. 3, IEEE, Los Alamitos, CA.

Weitzel, C.E., "RF Power Devices for Wireless Communications," 2002 IEEE MTT-S CDROM, 2002, pp. 285-288, paper TU4B-1, IEEE, Los Alamitos, CA.

Williams, R., "Modern GaAs Processing Methods," 1990, pp. 66-67, Artech House, Inc., Norwood, MA.

Wu, C.S., et al., "Pseudomorphic HEMT Manufacturing Technology for Multifunctional Ka-Band MMIC Applications," IEEE Transactions on Microwave Theory and Techniques, Feb. 1995, pp. 257-265, vol. 43, No. 2, IEEE, New York, US.

"Advanced Synchronous Rectified Buck MOSFET Drivers with Pre-POR OVP," ISL6612A, ISL6613A, Data Sheet FN9159.6, Jul. 27, 2006, pp. 1-12, Intersil Americas Inc., Milpitas, CA.

Bergman, J., "Development of Indium Arsenide Quantum Well Electronic Circuits: A Dissertation Presented to the Academic Faculty," http://smartech.gatech.edu/bitstream/1853/5033/1/bergman_joshua_i_200407_phd.pdf, Jul. 2004, 225 pp., Georgia Institute of Technology, Atlanta, GA.

* cited by examiner

SEMICONDUCTOR DEVICE HAVING MULTIPLE LATERAL CHANNELS AND METHOD OF FORMING THE SAME

This application is a continuation of patent application Ser. No. 11/128,623, entitled "Semiconductor Device Having Multiple Lateral Channels and Method of Forming the Same," filed on May 13, 2005, now U.S. Pat. No. 7,339,208, which application is incorporated herein by reference.

TECHNICAL FIELD

The present invention is directed, in general, to semiconductor devices and, more specifically, to a semiconductor device having multiple lateral channels and a method of forming the same.

BACKGROUND

A field-effect transistor (also referred to as a "FET") is a conventional semiconductor device employable in switch-mode power supplies for use in data processing and telecommunication systems as well as for other applications that use conditioned power for the operation of sensitive electronic circuits. Field-effect transistors have almost universally replaced bipolar transistors previously used for inverters (a type or portion of a power supply) as well as the p-n and Schottky diodes used for rectification. The proliferation of field-effect transistors has, at least in part, been driven by the need to provide highly efficient power supplies with low dc output voltages such as five volts or less at higher current levels. The broad acceptance of field-effect transistors for the aforementioned applications is a consequence of the low forward voltage drop and fast switching speed as well as the low power consumption employed to enable or disable conduction thereof. As a result, the use of field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, the power supply switching frequencies above one megahertz ("MHz") are desirable to reduce the size of magnetic devices and the capacitive filtering elements of the power supply without compromising the power conversion efficiency. In accordance therewith, field-effect transistors with previously unrealizable characteristics are not only being requested, but are necessary to satisfy the aforementioned conditions.

A material of choice for high performance field-effect transistors is a semiconductor with high electron mobility and wide band gap for high breakdown voltage that is capable of being processed with conventional equipment and methods not substantially different from those already developed for silicon and present generations of compound semiconductors. A particularly desirable material is the compound semiconductor known as gallium arsenide ("GaAs"), which has been used for integrated circuits operable at frequencies well above one gigahertz, and which has been used to produce power field-effect transistors with high performance characteristics. An exemplary performance of gallium arsenide in comparison to other semiconductor materials for high performance field-effect transistors is described in "Fundamentals of III-V Devices" by W. Liu, published by John Wiley and Sons (1999), and "Modern GaAs Processing Methods" by R. Williams, published by Artech House (1990), which are incorporated herein by reference.

Additionally, examples of gallium arsenide field-effect transistors employing a controllable vertical channel between a source and drain thereof are provided in the following references, namely, U.S. Pat. No. 5,889,298 entitled "Vertical JFET Field Effect Transistor," by Plumton, et al., issued on Mar. 30, 1999, U.S. Pat. No. 5,342,795 entitled "Method of Fabricating Power VFET Gate-Refill," by Yuan, et al., issued on Aug. 30, 1994, U.S. Pat. No. 5,468,661 entitled "Method of Making Power VFET Device," by Yuan, et al., issued on Nov. 21, 1995, U.S. Pat. No. 5,610,085 entitled "Method of Making a Vertical FET using Epitaxial Overgrowth," by Yuan, et al., issued on Mar. 11, 1997, and U.S. Pat. No. 5,624,860 entitled "Vertical Field Effect Transistor and Method," by Plumton, et al., issued on Apr. 29, 1997, which are incorporated herein by reference.

An exemplary gallium arsenide field-effect transistor as generally described in the aforementioned references is illustrated with respect to FIG. 1. The gallium arsenide field-effect transistor includes buried and inter-coupled gate fingers (also referred to as a gate and one of which is designated 110) formed in etched trenches in an n-doped drain 120 thereby producing vertical channels 130. The gates 110 exhibit a gate length (generally designated "GL") and the vertical channels 130 provide a channel opening (generally designated "CO"). The trenches are back-filled epitaxially with p-doped gallium arsenide to form the gates 110. A p+ implant 140 provides a top surface contact to the gates 110, and is made through a further n-doped epitaxial layer that forms a source 150. External connection to the gates 110 is made through metallized contacts 160 deposited over the heavily doped p+ implants 140. An external source contact 170 and drain contact 180 are made through metal depositions over further heavily doped areas. The structure produces vertical field-effect transistor channels between the gates 110, and provides source and drain contacts 170, 180, respectively, on opposing sides of the die. The device, therefore, operates with vertical carrier flow and the buried gates 110, typically doped opposite from the vertical channels 130, exhibit limited control over a fill profile thereof.

Thus, the field-effect transistor as described above does not accommodate a careful doping profiling and epitaxial layer design necessary to produce a modulation-doped channel that can be formed in a lateral channel and that may be employed to substantially reduce the on-resistance of the device. The field-effect transistor described above is not configured with a channel having a strained material, which would significantly improve a mobility of the current carrying carriers and, consequently, a switching speed thereof. This design methodology of constructing such gallium arsenide field-effect transistors has been analyzed in the following references, namely, "Comparison of GaAs and Silicon Synchronous Rectifiers in a 3.3V Out, 50 W DC-DC Converter," by V. A. Niemela, et al., 27th Annual, IEEE Power Electronics Specialists Conference, Vol. 1, June 1996, pp. 861-867, "10 MHz PWM Converters with GaAs VFETs," by R. Kollman, et al., IEEE Eleventh Annual Applied Power Electronics Conference and Exposition, Vol. 1, March 1996, pp. 264-269, "A Low On-Resistance High-Current GaAs Power VFET," by D. L. Plumton, et al., IEEE Electron Device Letters, Vol. 16, Issue 4, April 1995, pp. 142-144, and "RF Power Devices for Wireless Communications," by C. E. Weitzel, IEEE MTT-S2002, paper TU4B-1, which are incorporated herein by reference. The structure as generally described in the aforementioned references has higher channel and gate resistance per unit die area than the desired resistance and produces a device operable only in the depletion mode, which may limit the applicability of the device in certain situations. Additionally, the devices described in the aforementioned references do not include an intrinsic body diode. The resulting cost and performance have resulted in limited marketability in view of the presently available silicon-based technology.

Another example of a vertical channel gallium arsenide field-effect transistor is described in "Manufacturable GaAs VFET for Power Switching Applications," by K. Eisenbeiser, et al., IEEE Electron Device Letters, Vol. 21, No. 4, pp. 144-145 (April 2000), which is incorporated herein by reference. The reference describes forming a source contact on a top surface of the die and a drain contact on the bottom. A vertical channel, however, is still provided in the design proposed by Eisenbeiser, et al. Although economies of manufacture are achieved using implants rather than etching and epitaxial growth as described by Eisenbeiser, et al., possible disadvantages of a channel with a vertical structure limit the switching speed and operation as an enhancement-mode device.

R. Williams describes a GaAs power field-effect transistor in "Modern GaAs Processing Methods," incorporating both the source and drain contacts on the upper side of a die with a lateral channel and is illustrated with respect to FIG. 2A. The gallium arsenide field-effect transistor acting as a power field-effect transistor includes a gate 205 interposed between a source 210 and drain 215, creating a lateral channel in an n-doped GaAs layer 220. A depletion region 225 is formed under the gate 205 and a shallower depletion region 230 forms generally under an upper surface of the die as a result of an inherent existence of surface states at the surface of the crystal (i.e., a surface pinning effect). The gallium arsenide field-effect transistor is formed over a semi-insulating GaAs substrate 235. Designing the source and drain contacts on the same surface of the die requires a complicated multilayer metallization process and results in increased die area and reduced chip yield. The aforementioned configuration can also lead to increased inductance, which is of significance in applications for microwave signal amplification. Also, the gallium arsenide field-effect transistor does not include an intrinsic body diode.

Another gallium arsenide field-effect transistor is described by R. Williams at pp. 66-67 of "Modern GaAs Processing Methods," which is configured with source and drain contacts on opposing sides of the die and a lateral channel, and is illustrated with respect to FIG. 2B. The gallium arsenide field-effect transistor includes a plated air bridge 250 coupled to a source (generally designated "S") on an upper side of the die. Gates (generally designated "G") are interposed between drains (generally designated "D"), and are also located on the upper surface of the die. Couplings to the source are brought down to a lower surface of the die by vias 265 that are plated-through holes between the lower surface and the source and are further coupled together by a plated heat sink 280. Although this arrangement can provide low-inductance external connections to the source, it is limited in its ability to provide a low-resistance channel tightly coupled to the lower surface of a highly conductive substrate, or an intrinsic body diode.

The aforementioned design also does not accommodate large drain contacts desirable for a higher power device, which will increase the resistive and inductive losses. This configuration requires a complex air-bridge processing step, which will increase the cost and potentially affect the reliability of the device. For the large gate width field-effect transistor, the parasitic resistance in series with the source will increase due to the long air-bridge connection. This design also is incompatible with today's packaging techniques for higher power devices embodied in a vertical device configuration.

Additionally, U.S. Pat. No. 6,309,918 entitled "Manufacturable GaAs VFET Process," by Huang, et al, issued on Oct. 30, 2001, is directed toward a vertical FET with source and drain contacts on opposing sides of a die. U.S. Pat. No. 5,956,578 entitled "Method of Fabricating Vertical FET with Schottky Diode," by Weitzel, et al, issued on Sep. 21, 1999, and U.S. Pat. No. 6,097,046 entitled "Vertical Field Effect Transistor and Diode," by Plumton, issued on Aug. 1, 2000, are directed toward a vertical FET on a compound semiconductor substrate with an integrated Schottky diode on an upper surface of the die. Neither of the aforementioned references, which are also incorporated herein by reference, provides low on-resistance using a conductivity-enhanced lateral channel.

Still further references such as U.S. Pat. No. 5,068,756 entitled "Integrated Circuit Composed of Group III-V Compound Field Effect and Bipolar Semiconductors," by Morris, et al., issued on Nov. 26, 1991, and U.S. Pat. No. 5,223,449 entitled "Method of Making an Integrated Circuit Composed of Group III-V Compound Field Effect and Bipolar Semiconductors," by Morris, et al., issued on Jun. 29, 1993, which are incorporated herein by reference, describe an integration of multiple semiconductor devices on a die including n- and p-channel junction field-effect transistors with a lateral channel. These devices include an isolation trench surrounding the devices, etched to a lower semi-insulating gallium arsenide layer and backfilled with silicon nitride. The aforementioned devices, however, are configured with contacts on a top surface, which restricts their application from low voltage, high current systems wherein efficiency is an important design element.

Low on-resistance compound semiconductor field-effect transistors has been enhanced by the use of a layering structure called modulation doping as described in "Fundamentals of III-V Devices" by W. Liu (p. 323) and "Ultra-High Speed Modulation-Doped Field-Effect Transistors: A Tutorial Review," L. D. Nguyen, et al., Proceedings of the IEEE, Vol. 80, No. 4, pp. 494-518 (April 1992), which are incorporated herein by reference and are particularly applicable to devices with a lateral channel. The objective of modulation doping is to avoid electron scattering in the current conducting channel by ionized impurities due to dopants, which increases channel resistivity due to the decreased carrier mobility. Channel conductivity may be modulated by a separate control element such as a gate that controls channel depletion.

The modulation doping technique has been developed for lateral channels using, for instance, gallium arsenide as an undoped, narrower band gap channel and including an adjacent, doped, wider band gap layer of aluminum gallium arsenide, which provides an abundant and controllable source of free carriers to the gallium arsenide channel. Other combinations of compound semiconductors can be used such as an undoped indium gallium arsenide channel and an adjacent, doped aluminum gallium arsenide layer as the source of free carriers. Successful and repeatable applications of modulation doping, which is based on precision formation of a pseudomorphic layer, employs lateral channel arrangements that are not presently available in devices configured with vertical channels.

Considering the limitations as described above, a field-effect transistor design is not presently available for the more severe applications that lie ahead. Accordingly, what is needed in the art is a gallium arsenide and other compound semiconductor devices configured for wide acceptance, particularly in low voltage and high current applications, overcoming many of the aforementioned limitations. In accordance therewith, a compact and efficient power supply, particularly for very low voltage and high current loads such as microprocessors, as well as amplifiers for telecommunications and other applications, would benefit from a robust field-effect transistor without incurring unnecessary costs or the need to commit a substantial portion of the physical volume of the end device to the power supply.

SUMMARY OF THE INVENTION

These and other problems are generally solved or circumvented, and technical advantages are generally achieved, by advantageous embodiments of the present invention which includes a semiconductor device having multiple lateral channels and a method of forming the same. In one embodiment, the semiconductor device includes a conductive substrate having a first contact covering a substantial portion of a bottom surface thereof. The semiconductor device also includes a first lateral channel above the conductive substrate and a second lateral channel above the first lateral channel. The semiconductor device further includes a second contact above the second lateral channel. The semiconductor device still further includes an interconnect that connects the first and second lateral channels to the conductive substrate operable to provide a low resistance coupling between the first contact and the first and second lateral channels.

In another aspect, the present invention provides a semiconductor device including a substrate having a source contact covering a substantial portion of a bottom surface thereof and a first buffer layer formed over the substrate. Additionally, the semiconductor device includes an isolation layer, a first spacer layer, a second buffer layer, a first barrier layer, and a second spacer layer formed between the first buffer layer and a first lateral channel. The semiconductor device also includes third and fourth spacer layers, a second lateral channel, fifth and sixth spacer layers and a third lateral channel formed over the first lateral channel. The semiconductor device also includes a seventh spacer layer and a second barrier layer formed over the third lateral channel. A recess layer and an etch-stop layer are thereafter formed between the second barrier layer and first and second source/drain contact layers. The semiconductor device further includes a source interconnect that connects the first, second and third lateral channels to the substrate operable to provide a low resistance coupling between the source contact and the first, second and third lateral channels. A gate of the semiconductor device is located in a gate recess formed through the first and second source/drain contact layers, the etch-stop and the recess layer. A dielectric layer is thereafter formed over the gate, and the first and second source/drain contact layers. The semiconductor device still further includes a drain post located in a drain via formed through the dielectric layer and over the first and second source/drain contact layers, and a drain contact is coupled to the drain post.

In yet another aspect, the present invention provides a semiconductor device including a conductive substrate having a first contact covering a substantial portion of a bottom surface thereof. The semiconductor device also includes first and second lateral channels above the conductive substrate, and a second contact above the second lateral channel. The semiconductor device further includes an interconnect that connects the first and second lateral channels to the conductive substrate operable to provide a low resistance coupling between the first contact and the first and second lateral channels. The semiconductor device still further includes an intrinsic body diode operable to provide a conductive path between the first and second contacts.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
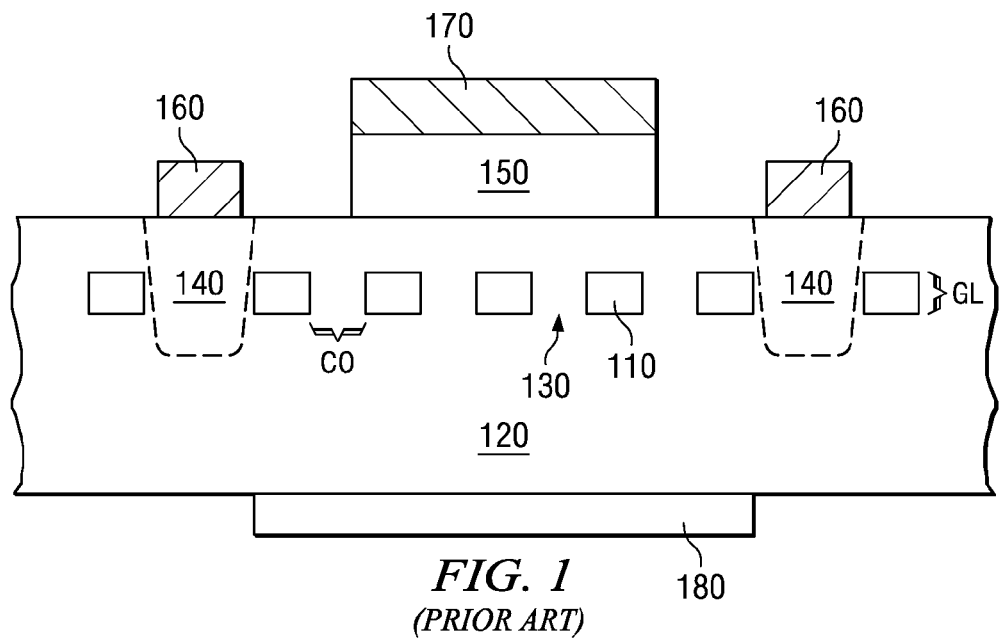
FIGS. 1, 2A and 2B illustrate cross sectional views of field-effect transistors according to the prior art.
Figure 2A:
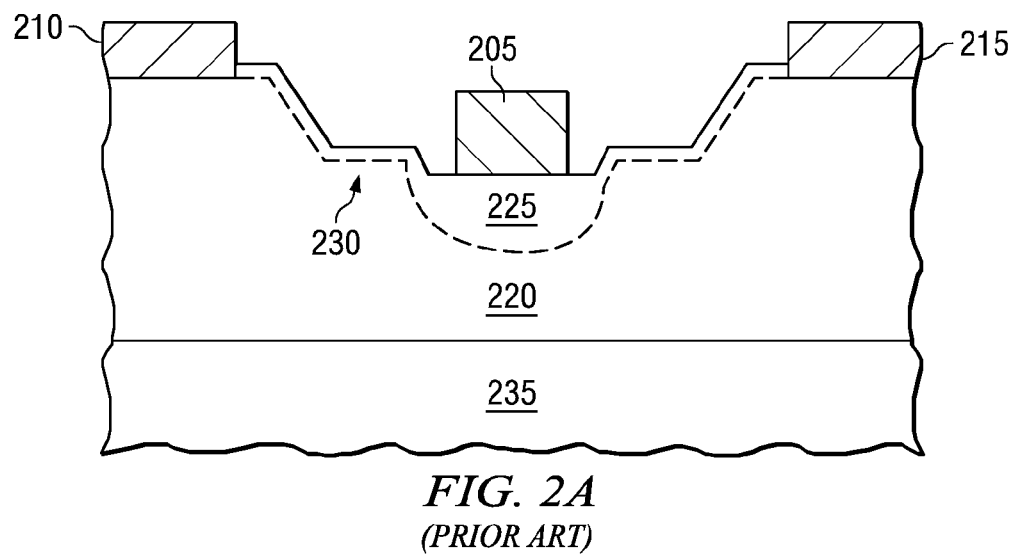
Figure 2B:
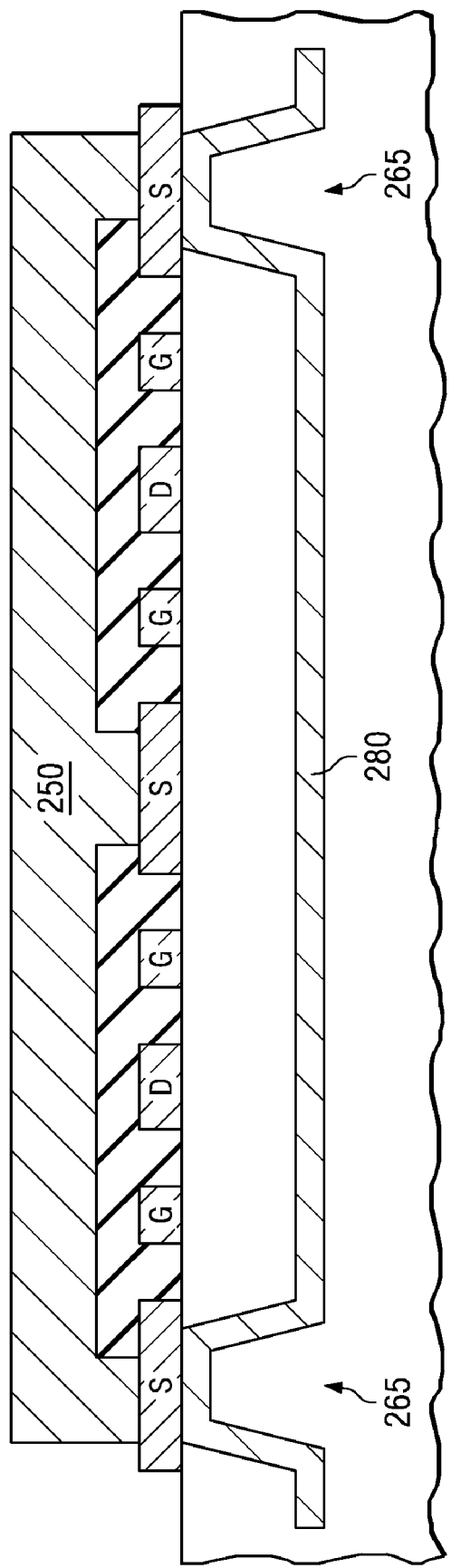

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a semiconductor device and, more particularly, a substrate driven FET. A substrate driven FET is configured with a source contact coupled to a substrate and a drain contact coupled to an opposing surface of the device to provide a low on-resistance switch with very fast switching transition times. The substrate driven FET also includes multiple lateral channels to, among other things, further reduce an on-resistance thereof. The principles of the present invention may be applied to a compound semiconductor FET with modulation-doped lateral channels and other semiconductor devices that include current-carrying channels including modulation-doped lateral channels and switched terminals on opposing surfaces thereof. Thus, the principles of the present invention apply to semiconductor devices having multiple lateral channels and contacts on opposing surfaces thereof. For an example of a related semiconductor device, see U.S. Patent Application Publication No. 2006/0226478, entitled "Semiconductor Device Having a Lateral Channel and Contacts on Opposing Surfaces Thereof," to Brar, et al., published Oct. 12, 2006, which is incorporated herein by reference.

The inclusion of multiple lateral channels in a semiconductor device recognizes the limited improvement in on-resistance that can be obtained by simply increasing the thickness of a single lateral channel. Carriers in the lateral channel flow near the channel edges due to highly localized electric field distributions within the lateral channel, and this limits an improvement of the on-resistance as the lateral channel is made thicker. A single thicker lateral channel made of material with a different lattice constant from a substrate exhibits more numerous atomic dislocations in the crystal lattice, which degrades the carrier mobility and device break down characteristics. A further benefit of multiple lateral channels is an increase in transconductance of the semiconductor device for a given device area. Improvements in the on-resistance and transconductance for presently available semiconductor devices ordinarily comes at the expense of greater die area, which has a direct effect on the cost and yield of the semiconductor device. By incorporating multiple channels into the semiconductor device constructed according to the principles of the present invention, the semiconductor device can achieve improvements in on-resistance and transconductance without the limitations as discussed above.

Exemplary characteristics and advantages associated with the use of selected embodiments of the substrate driven FET according to the principles of the present invention are set forth below. The substrate driven FET may be capable of switching transition times on the order of nanoseconds, rather than switching transition times on the order of 35 to 50 nanoseconds realizable with the present silicon-based technology. The substrate driven FET may exhibit peak inverse voltage ratings such as 10 to 20 volts or less and should have low on-resistance including the parasitic electrical resistance from the device packaging approaching one milliohm or less. In addition, the substrate driven FET desirably has gates that can be driven with digital logic, with low gate charge and correspondingly low and controllable field-effect transistor threshold voltage. The substrate driven FET also desirably has current ratings of at least a dozen amperes, and should be cost competitive with presently available field-effect transistors having similar power ratings implemented in silicon-based technology. The substrate driven FET also desirably includes an intrinsic body diode that is capable of conducting substantially the full rated device current.

Additionally, the substrate driven FET having source and drain contacts on opposing sides of the die facilitates low resistance and inductance packaging by providing more area for the contacts. The substrate driven FET may also operate as an enhancement-mode device which implies a normally-off device when a gate voltage is substantially zero volts to avoid short circuits during power supply start-up. The presence of an intrinsic body diode with the anode coupled to a source interconnect and source contact can also provide substantial benefits in circuit design as well as cost reduction, particularly in power supply applications.

In the drawings, boundaries may be shown as lines to separate semiconductor regions or layers with apparent abrupt changes in doping levels or species. It is recognized that semiconductor manufacturing processes such as implantation and diffusion may cause doping concentrations and atomic species to vary in a continuous and sometimes gradual manner across a semiconductor device. Consequently, graded boundaries of device regions may be shown as lines in the drawings for explanatory purposes without compromising an understanding of the structure of the devices.

Many steps conventionally used to process a gallium arsenide (also referred to as "GaAs") die or wafer and other compound semiconductors as described herein are well known in the art, and, in the interest of brevity, will not be described in detail. The basic steps include, for example, molecular-beam epitaxy, metal-organic chemical vapor deposition, patterning, exposing, etching, vacuum depositing, plating, doping, alloying, annealing, and cleaning. For reference purposes, R. Williams describes many conventional processes for constructing a gallium arsenide device in "Modern GaAs Processing Methods." Additionally, several separate processing steps may be generally combined into a single step within the scope of the present invention, such as a combined annealing step wherein a number of alloys that are separately deposited are heated together to jointly activate the alloys. Further, alternative methods to perform a processing step such as vacuum deposition, sputtering, or plating processes may be combined or performed separately without further elaboration herein. Also, while selected doping levels and characteristics such as thickness of layers that make up an exemplary substrate driven FET will hereinafter be provided, those skilled in the art understand that alternative doping levels and characteristics may be provided and still be within the broad scope of the present invention. For instance and in the appropriate circumstances, the layers may be oppositely doped, such as a p-type layer may be replaced with an n-type layer.

Figure 3:
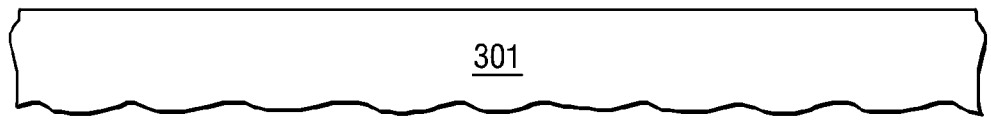
FIGS. 3 to 21 illustrate cross sectional views of an embodiment of constructing a semiconductor device according to the principles of the present invention.

Referring now to FIGS. 3 to 21, illustrated are cross sectional views of an embodiment of constructing a semiconductor device (e.g., substrate driven FET) according to the principles of the present invention. Beginning with FIG. 3, the substrate driven FET is formed on a substrate (e.g., GaAs substrate) 301. Preferably, the substrate 301 is n-doped and is a highly conductive layer (e.g., a conductive substrate) with a doping level in the range of $7\times10^{17}$ to $5\times10^{18}$ cm$^{-3}$. The substrate 301 may be chosen to be sufficiently thick to provide mechanical and chemical support for semiconductor processing and handling, and may be supported by a further underlying medium. The substrate 301 provides a source connection for the substrate driven FET, accommodating a low-resistance connection over a substantial portion of the lower surface thereof.

A preferred n-type doping material for GaAs is silicon ("Si"), but selenium ("Se"), tellurium ("Te") or other doping materials or combinations thereof may be employed within the broad scope of the present invention. Although the substrate driven FET described herein is GaAs based, alternative semiconductor materials may be employed to form the substrate 301 such as a semiconductor material based on indium-phosphide ("InP") as well as oppositely doped semiconductors with essential properties of related materials appropriately altered.

Figure 4:
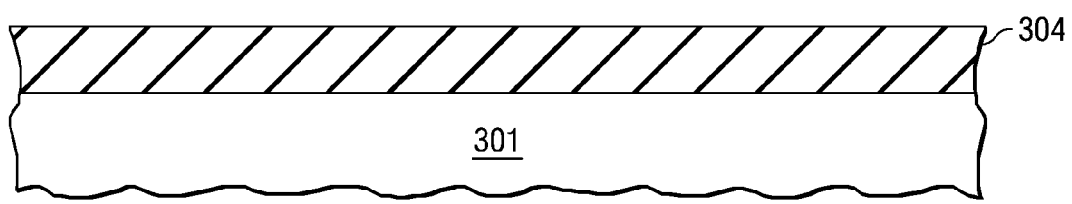

Turning now to FIG. 4, above the substrate 301 is a first buffer layer (e.g., an n+ epitaxial buffer layer) 304 that is preferably grown via molecular beam epitaxy or metal-organic chemical-vapor deposition to a thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7 \times 10^{17}$ to $5 \times 10^{18}$ cm$^{-3}$. The addition of the first buffer layer 304 generally provides a more uniform crystal structure for further epitaxial depositions than an ordinary, doped GaAs substrate 301, and thus may be optionally included for the formation of the above layers for improved device characteristics.

Figure 5:
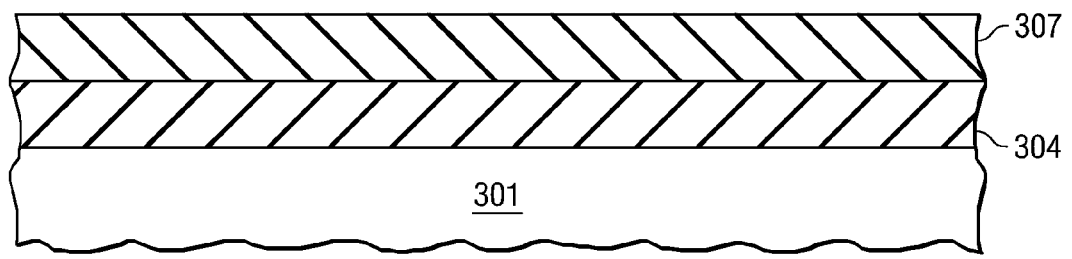
Figure 6:
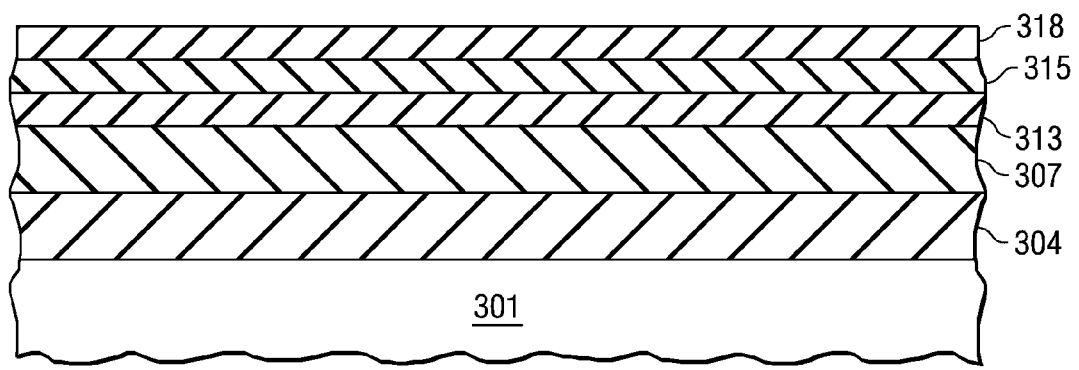

Turning now to FIGS. 5 and 6, above the first buffer layer 304 is an isolation layer (e.g., a p-doped isolation layer) 307 that is epitaxially grown and formed sufficiently thin to prevent substantial recombination of minority carriers that might be injected therein during certain modes of operation of the substrate driven FET. A preferred thickness of the isolation layer 307 is approximately 1000 Å and a preferred dopant is carbon with a doping density between about $5 \times 10^{18}$ cm$^{-3}$ to $5 \times 10^{19}$ cm$^{-3}$. A thickness of the isolation layer 307, however, can range from about 300 Å to 2000 Å and beyond, and may be deposited with a doping density roughly inversely proportional to the thickness.

The isolation layer 307 forms a pair of back-to-back diodes with n-doped layers formed thereabove and the buffer layer 304 to substantially block current flow when the substrate driven FET is in a non-conducting state, particularly when a positive voltage is applied between the drain and source contacts thereof. The design parameters for the layers above the isolation layer 307 elicit engineering trade-offs and should be chosen to preserve a lifetime of the minority carriers (i.e., electrons) injected therein so that the minority carriers diffuse through the substrate driven FET with sufficiently limited recombination. Additionally, the above-referenced layers should be designed to provide a high degree of conductivity for the substrate driven FET, limit a break-down, and limit the internal fields when the layer(s) above the isolation layer 307 act as the cathode for the back-to-back diodes, thereby providing reverse voltage blocking capability. Also, the layers above the isolation layer 307 of the substrate driven FET should be provided to enhance a performance thereof such as sustaining a high drain-to-source voltage (e.g., 20 volts) when the substrate driven FET is in a non-conducting state and to provide support for lateral channels formed thereover.

A first spacer layer 313 is a thick, but lightly doped p-type GaAs layer that is epitaxially deposited at about 10000 Å and preferably lightly doped to about $1 \times 10^{15}$ cm$^{-3}$ above the isolation layer 307. The first spacer layer 313 limits an internal electric field within the substrate driven FET and helps to limit breakdown when the substrate driven FET is transitioned to a non-conducting state. As a result, an applied voltage is substantially blocked between the source and drain terminals thereof. The first spacer layer 313 is lightly doped and sufficiently thick, such as 5000 Å to 20000 Å, to provide a sufficiently high voltage blocking capability for the substrate driven FET. Different layer thickness ranging from 5000 Å to 20000 Å and doping levels such as $1 \times 10^{15}$ cm$^{-3}$ to $5 \times 10^{16}$ cm$^{-3}$ may be used depending on, for example, the appropriate level of voltage blocking necessary for the substrate driven FET. An undoped layer or a lightly doped n-type layer can also be used in place of the lightly doped p-type layer.

A second buffer layer 315 located above the first spacer layer 313 is an alternating aluminum-gallium arsenide/gallium arsenide ("AlGaAs/GaAs") super-lattice buffer that is sequentially deposited epitaxially to improve the smoothness of the surface of the crystal and to increase the mobility of the electrons in the channel to be formed thereabove. The presence of aluminum may also act as a "getter" to capture and disable oxygen atoms that may otherwise be present in the subsequent growth. The second buffer layer 315 is deposited preferably with ten alternating layers of AlGaAs (0.24 Al), preferably about 185 Å thick, and GaAs, preferably about 15 Å thick. The total thickness of the second buffer layer 315 is approximately 2000 Å.

A first barrier layer 318 located above the second buffer layer 315 is an aluminum-gallium arsenide-phosphide AlGaAsP (0.24 Al and 0.05 P) bottom barrier/spacer that is epitaxially deposited at approximately 1000 Å to substantially block the free carriers from flowing down to the layers therebelow. An n-pulse doping with Si ("delta doped"), preferably to a level of about $4 \times 10^{12}$ cm$^{-2}$, is thereafter performed thereon to supply the free carriers to the channel thereabove by the mechanism of modulation doping. The isolation layer 307, therefore, lies between n-doped layers, thereby forming the back-to-back diodes that provide an isolation capability for the substrate driven FET. During transient conditions lasting perhaps a nanosecond when the substrate driven FET is transitioned to a non-conducting state, however, a cloud of free electrons positioned above the isolation layer 307 is not able to substantially recombine therein. The effect is to enable a brief period of conduction in the parasitic n-p-n transistor wherein the n-doped layer above forms the emitter, the p-doped layers form the base, and the n-doped layer below forms the collector. The resulting parasitic transistor is able to shunt current between the source and the drain during transient conditions when, for instance, the substrate driven FET is transitioned to a non-conducting state. When the overlying electron gas is dissipated after the brief transient conditions, the parasitic transistor transitions to a non-conducting state.

Figure 7:
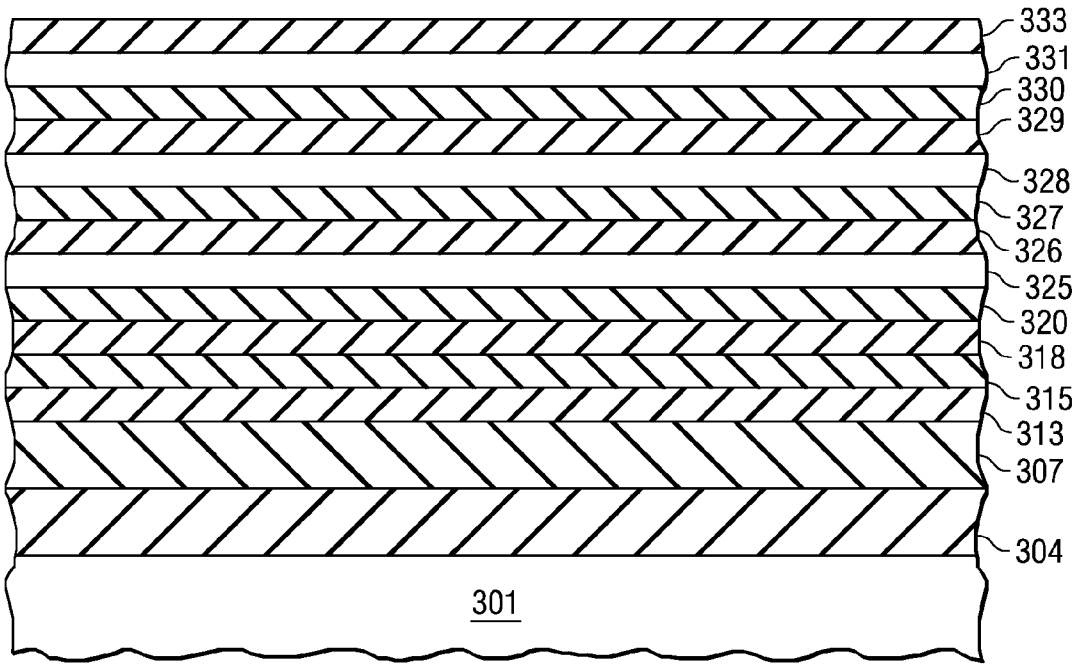

Turning now to FIG. 7, a second spacer layer 320 [e.g., a substantially undoped AlGaAsP (0.24 Al and 0.05 P) spacer] is then epitaxially deposited at approximately 40 Å above the first barrier layer 318 to separate the effects of dopants from the channel, thereby separating the free carriers from the ionized sites and improving the electron mobility therein. Above the second spacer layer 320 is a thin, indium-gallium arsenide ("InGaAs") layer that is epitaxially deposited with about 20% indium to form a first lateral channel 325 with controllable conductivity. Due to the substantial lattice mismatch between GaAs and InGaAs, the first lateral channel 325 is inherently lattice-strained (i.e., it is "pseudomorphic") and is preferably less than about 100 Å to prevent lattice dislocations and formation of polycrystalline structure in the layers to be deposited thereabove. The lattice-strained channel provides higher carrier mobility owing to a reduced effective mass of the carriers. The first lateral channel 325 provides the controllable conduction mechanism between the source and drain of the substrate driven FET and provides a modulation-doped channel with reduced crystalline irregularities for the free carriers supplied by adjacent layers.

A third spacer layer 326 [e.g., a substantially undoped AlGaAsP (0.24 Al and 0.05 P) spacer] is then epitaxially deposited at approximately 40 Å above the first lateral channel 325 to separate the effects of dopants from the channel, thereby separating the free carriers from the ionized sites and improving the electron mobility therein. An n-pulse doping with Si ("delta doped"), preferably to a level of about $4 \times 10^{12}$ cm$^{-2}$, is thereafter performed thereon to supply the free carriers to the first lateral channel 325 below and to a second lateral channel to be deposited thereabove by the mechanism of modulation doping. A fourth spacer layer 327 [e.g., a substantially undoped AlGaAsP (0.24 Al and 0.05 P) spacer] is then epitaxially deposited at approximately 40 Å above the third spacer layer 326 to separate the effects of dopants from a second lateral channel to be deposited thereabove, again separating the free carriers from the ionized sites and improving the electron mobility of a second lateral channel.

Above the fourth spacer layer 327 is a second, thin, indium-gallium arsenide ("InGaAs") layer that is epitaxially deposited with about 20% indium to form a second lateral channel 328 with controllable conductivity. Again, due to the substantial lattice mismatch between GaAs and InGaAs, the second lateral channel 328 is inherently lattice-strained and is preferably less than about 100 Å to prevent lattice dislocations and formation of polycrystalline structure in the layers to be deposited thereabove.

A fifth spacer layer 329 [e.g., a substantially undoped AlGaAsP (0.24 Al and 0.05 P) spacer] is then epitaxially deposited at approximately 40 Å above the second lateral channel 328 to separate the effects of dopants from the second lateral channel as described hereinabove. An n-pulse doping with Si ("delta doped"), preferably to a level of about $4\times10^{12}$ cm$^{-2}$, is thereafter performed thereon to supply the free carriers to the second lateral channel 328 and to a third lateral channel to be deposited thereabove by the mechanism of modulation doping. A sixth spacer layer 330 [e.g., a substantially undoped AlGaAsP (0.24 Al and 0.05 P) spacer] is then epitaxially deposited at approximately 40 Å above the fifth spacer layer 329 to separate the effects of dopants from a third lateral channel above, thereby separating the free carriers from the ionized sites and improving the electron mobility of a third lateral channel.

Above the sixth spacer layer 330 is a third, thin, indium-gallium arsenide ("InGaAs") layer that is epitaxially deposited with about 20% indium to form a third lateral channel 331 with controllable conductivity. Again, due to the substantial lattice mismatch between GaAs and InGaAs, the third lateral channel 331 is inherently lattice-strained and is preferably less than about 100 Å to reduce lattice dislocations and formation of polycrystalline structure in the layers to be deposited thereabove.

Above the third lateral channel 331 is another region that is epitaxially deposited including sub-layers of AlGaAsP (0.24 Al and 0.05 P) to provide additional free carriers (electrons) for modulation doping of the third lateral channel 331, and to provide a barrier for the free carriers in the third lateral channel 331. A seventh spacer layer 333 is undoped and deposited at about 40 Å to provide a spacer layer separating the free carriers in the third lateral channel 331 from ionized impurity sites. A n-pulse doping with Si ("delta doped"), preferably to a level of about $4\times10^{12}$ cm$^{-2}$, is performed on the third spacer layer 333 to induce additional free electrons with enhanced mobility that migrate across the third spacer layer 333 to the third lateral channel 331.

The inclusion of phosphorus in the spacer layers mentioned above provides a mechanism to at least partially compensate for the mismatch of the lattice constant for the lateral channels. For example, the lattice constant for InAs is 6.0584 Å, which indicates that the inclusion of indium in the lateral channels increases the lattice constant thereof. In comparison, the lattice constant for GaAs, which forms the foundation of the substrate driven FET, is 5.6533 Å. The lattice constant for GaP is smaller (5.4512 Å) than that for GaAs and, as such, indicates that the inclusion of phosphorus in the spacer layers produces an opposite component of strain on the crystal thereby providing the compensation for the longer atomic spacing in the lateral channels resulting from the inclusion of indium atoms therein. In addition, the inclusion of phosphorus improves carrier confinement in the lateral channels due to its wider bandgap as opposed to, for instance, AlGaAs with the same aluminum composition. The strain balancing can be achieved by one of the following, namely, adjusting an indium composition in the lateral channels or a thickness thereof, and adjusting the phosphorous composition in the spacer layers or a thickness thereof. This will change the localized strain in the lateral channels and will change the carrier mobility. It also changes the height of the spacer layers and the aforementioned parameters may be adjusted to improve device performance. Thus, modulation doping is preferably achieved by separating the channel-conduction carriers from the carrier-contributing donor atoms located in the Si-pulsed areas. The carrier mobility in the first, second and third lateral channels 325, 328, 331 is thereby improved by providing a conductive path substantially undisturbed by lattice imperfections that would otherwise be affected by in-channel dopants.

Although the semiconductor device as described herein includes three lateral channels, semiconductor devices with at least two lateral channels are well within the broad scope of the present invention. When modifying the number of lateral channels, attention should be given to the concentration of phosphorous in the spacer layers, which relaxes the strain from the indium as described above. The inclusion of a plurality lateral channels improves the on-resistance of a semiconductor device designed with a given die area, almost in proportion to the number of lateral channels. In addition, the breakdown voltage of the semiconductor device may be increased by the inclusion of the multiple lateral channels due to the reduced localized electric distribution around the edges thereof.

Figure 8:
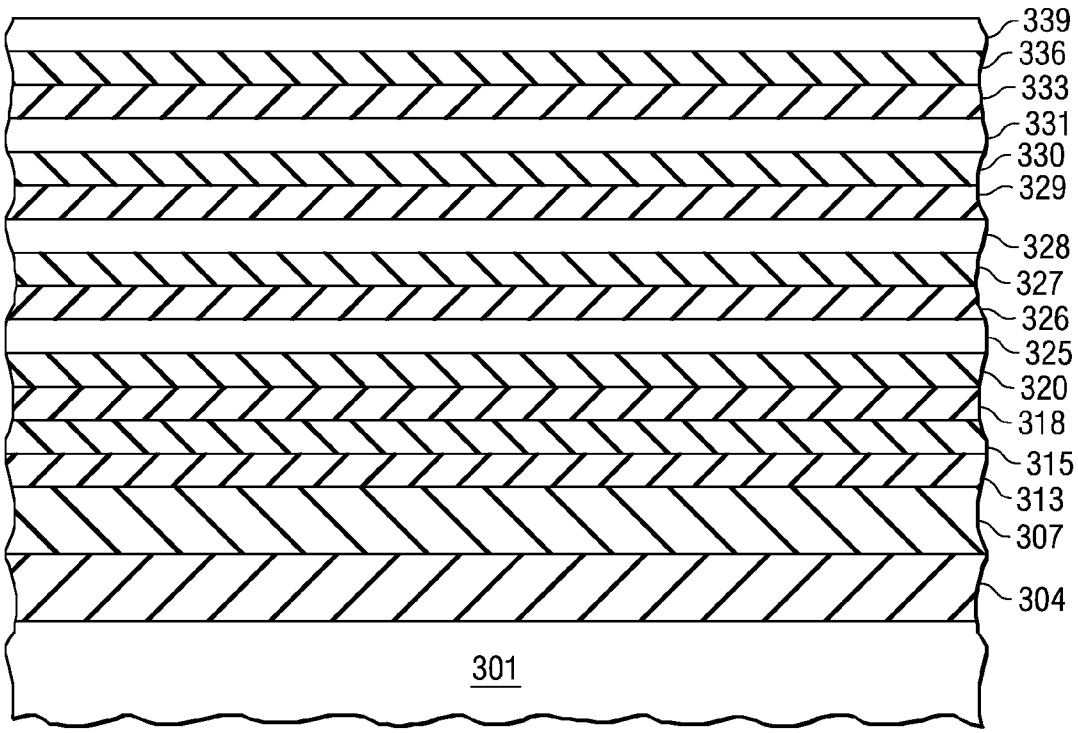

Turning now to FIG. 8, a second barrier layer 336 (embodied in an undoped AlGaAs layer) is then epitaxially deposited at about 210 Å with a doping level in the range of $1\times10^{17}$ to $5\times10^{17}$ cm$^{-3}$ or undoped. A recess layer 339 of GaAs is then epitaxially deposited, preferably at about 230 Å and Si-doped with a doping level in the range of $1\times10^{17}$ to $5\times10^{17}$ cm$^{313}$ or undoped.

Figure 9:
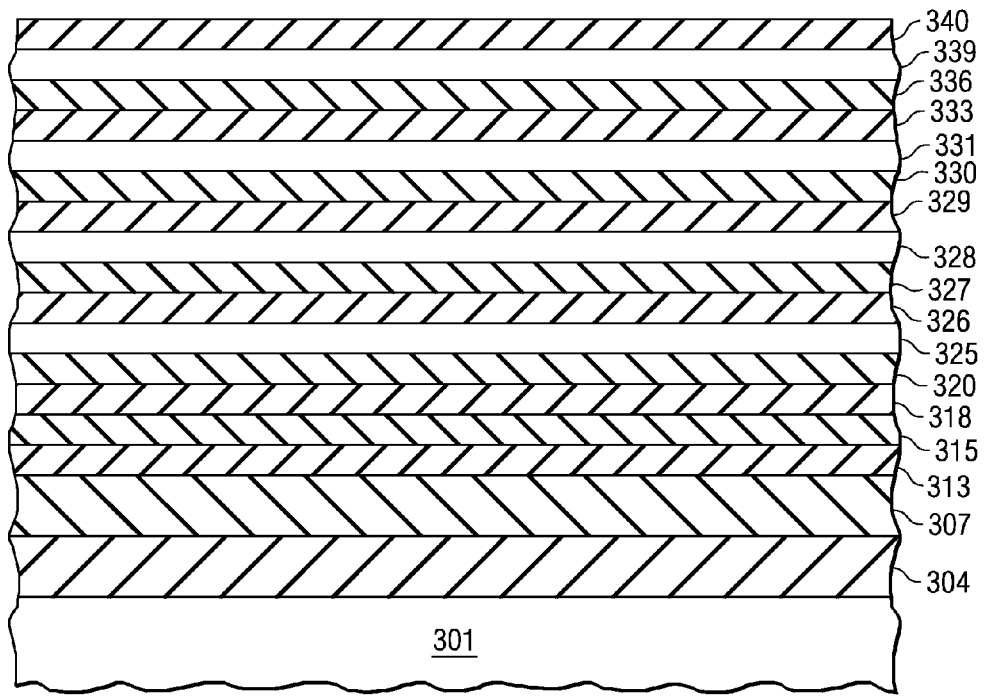

Turning now to FIG. 9, an etch-stop layer 340 embodied in a thin aluminum-arsenide ("AlAs"), indium-phosphide ("InP"), or indium-gallium-phosphide ("InGaP") epitaxial deposition is formed above the recess layer 339. The etch-stop layer 340 provides an etch stop for a later, trench-forming process for GaAs layers to be further deposited and doped thereabove. The etch-stop layer 340 is preferably about 25 Å thick and can be doped n-type with a doping level in the range of $1\times10^{17}$ to $5\times10^{18}$ cm$^{-3}$ or undoped.

Figure 10:
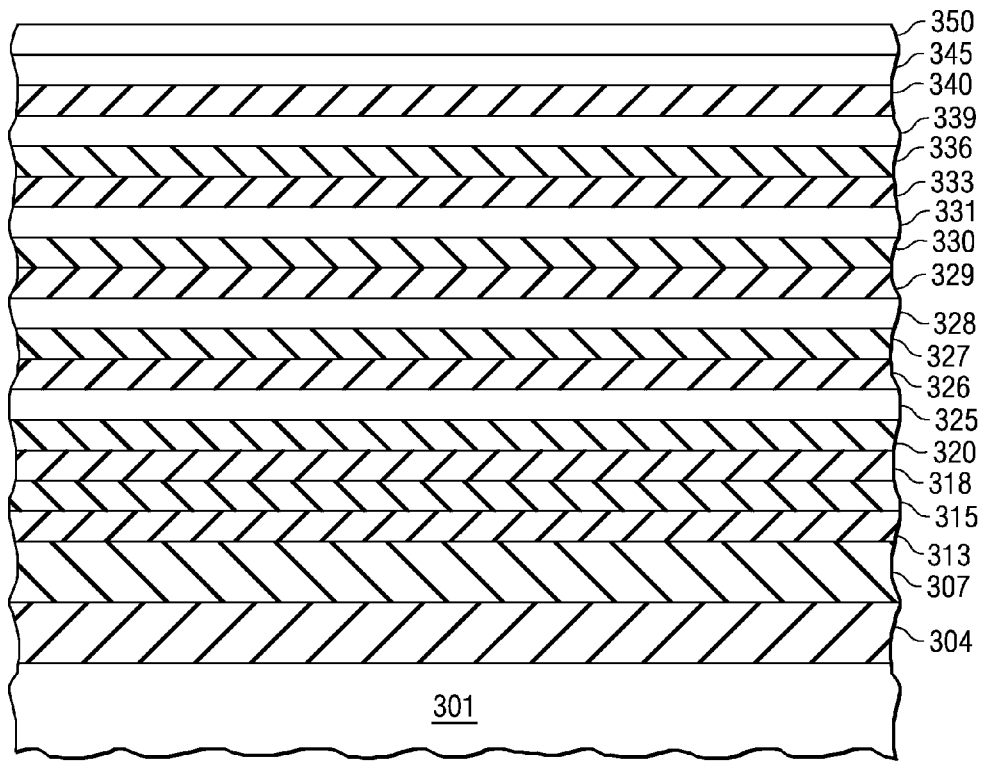
Figure 11:
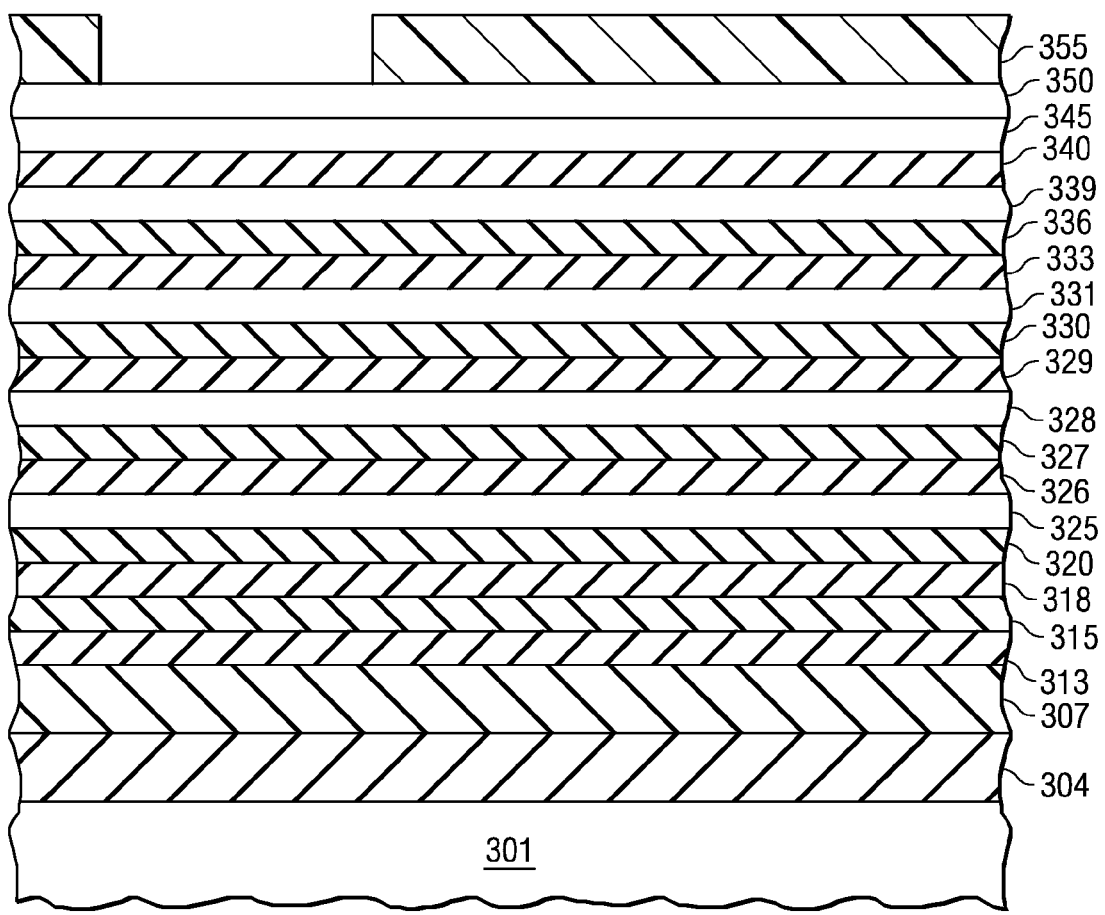
Figure 12:
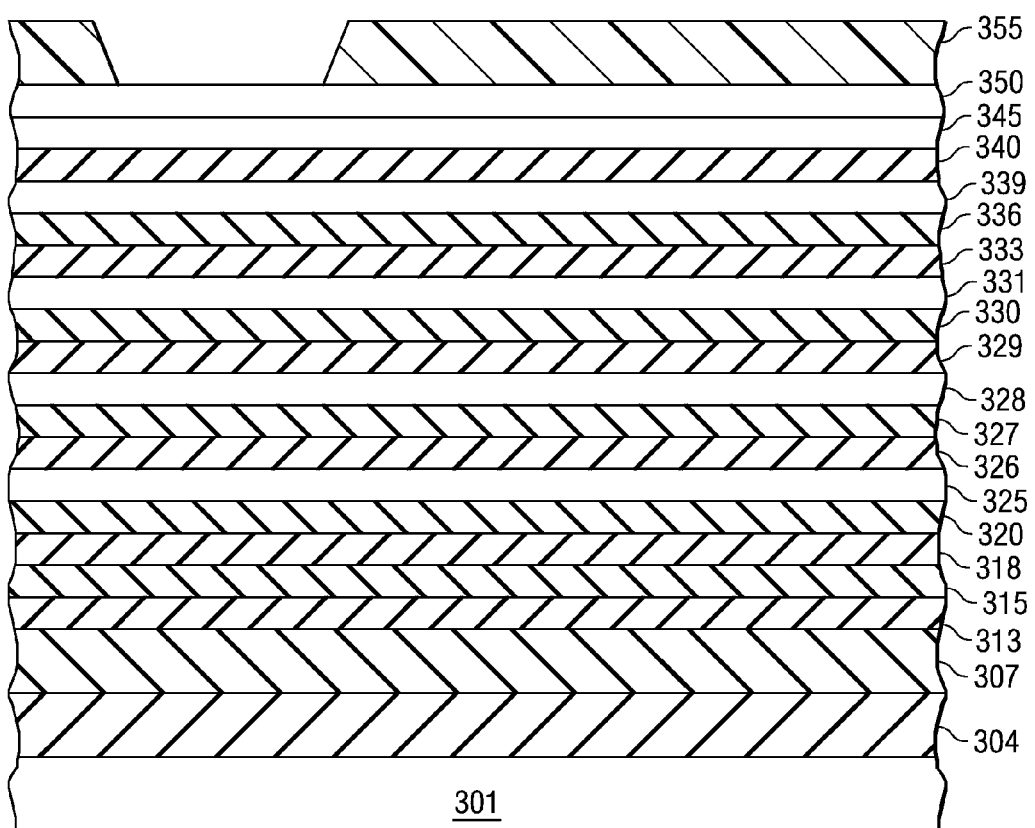

Turning now to FIG. 10, layers of GaAs are epitaxially deposited above the etch-stop layer 340 to form source and drain contact layers for the substrate driven FET. First, a first source/drain contact layer 345 of about 300 Å of an n-doped layer of GaAs is epitaxially deposited, preferably using Si as the dopant with a doping level in the range of $1\times10^{17}$ to $1\times10^{18}$ cm$^{-3}$. Then, a second source/drain contact layer 350 of about 500 Å of a heavily doped n+ layer of GaAs is epitaxially deposited with a doping level in the range of $1\times10^{18}$ to $1\times10^{19}$ cm$^{-3}$ to improve formation of ohmic contacts for the source and drain and to reduce resistance in the source-to-gate and drain-to-gate regions of the channels.

Turning now to FIGS. 11 to 15, illustrated are cross sectional views of an embodiment of constructing a source interconnect through the substrate driven FET in accordance with the principles of the present invention. The source interconnect is configured to create a low-resistance ohmic contact between the first, second and third lateral channels (also referred to as "lateral channels") 325, 328, 331 and the substrate 301. A spun-on photoresist 355 is illustrated with respect to FIG. 11 that has been masked, exposed and developed as is well known in the art to form a trench for access to the layers therebelow. The photoresist 355 is then baked (e.g., reflowed) such as on a hot plate or oven at about 110 to 150 degrees Celsius and in a normal atmosphere, which cures the photoresist 355 and causes a lower surface of the photoresist 355 facing the trench to encroach toward the trench, forming a generally angular aspect to the trench as illustrated with respect to FIG. 12. The angle of the slope in the photoresist 355 can be controlled by modifying a duration and temperature profile of the reflow process as is well understood in the art.

Figure 13:
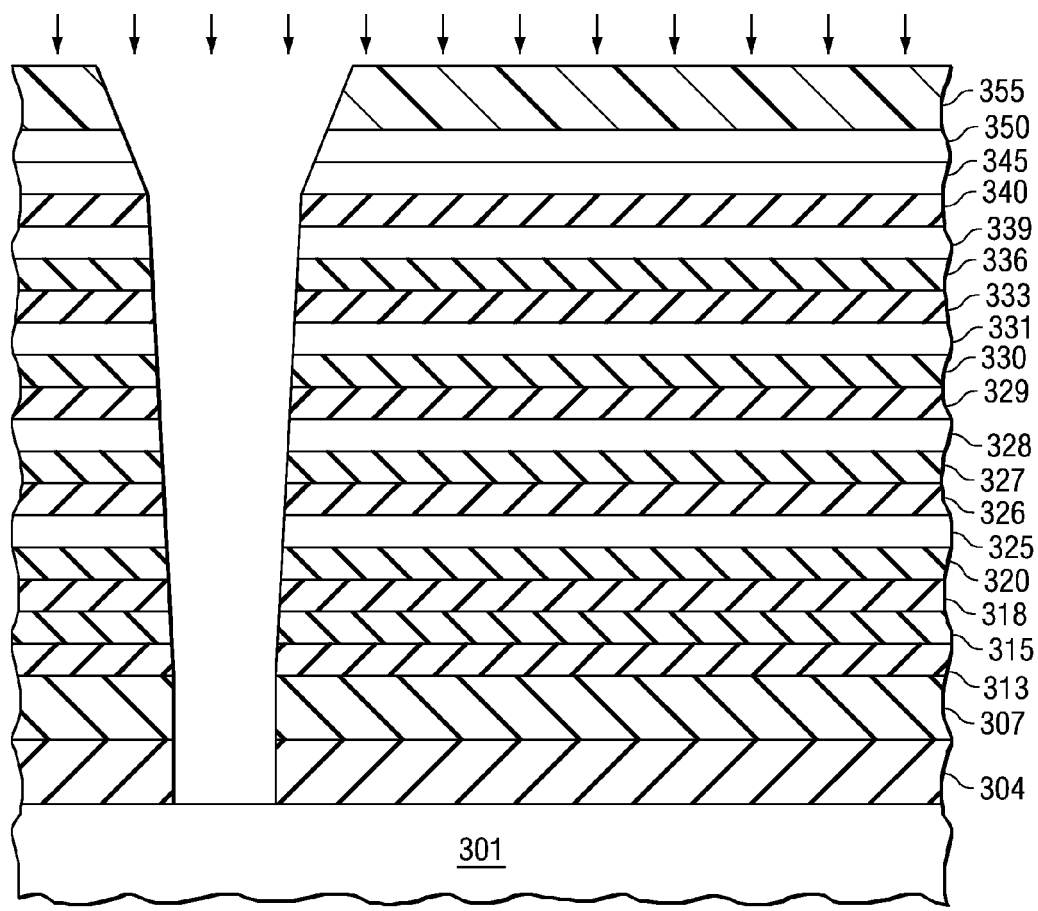

Turning now to FIG. 13, the portion of the substrate driven FET unprotected by the photoresist 355 is anisotropically dry etched, preferably using an inductively coupled plasma (i.e., an "ICP" dry etch). The anisotropic dry etch forms a source via (or trench) through the layers of the substrate driven FET down to the substrate 301 to create a low-resistance contact between the first, second and third lateral channels 325, 328, 331 and the substrate 301. The non-selective etching may further alter a profile of the photoresist 355. Gallium arsenide is generally etched faster than the photoresist 355 by the ICP dry etching, producing a general slope in the walls of the trench in exposed portions of the GaAs and can also produce sloping walls in exposed intervening layers (some slopes not shown).

The etching process is preferably continued for a controlled period of time until the source via is opened to the substrate 301. Alternatively, a thin etch-stop layer such as heavily n-doped aluminum oxide or indium-gallium phosphide ("InGaP") layer, both being substantially lattice-matched to the GaAs substrate, can be epitaxially deposited above the substrate 301 to form a barrier to limit the depth of the ICP dry etch. The etch-stop layer should not substantially affect conductivity to the substrate 301, if it is sufficiently thin and doped and can be subsequently removed. Preferably, an aluminum arsenide etch-stop layer would be about 50-100 Å thick depending on the proscribed etch resistance, but an InGaP layer which has better conductivity could be thicker.

Figure 14:
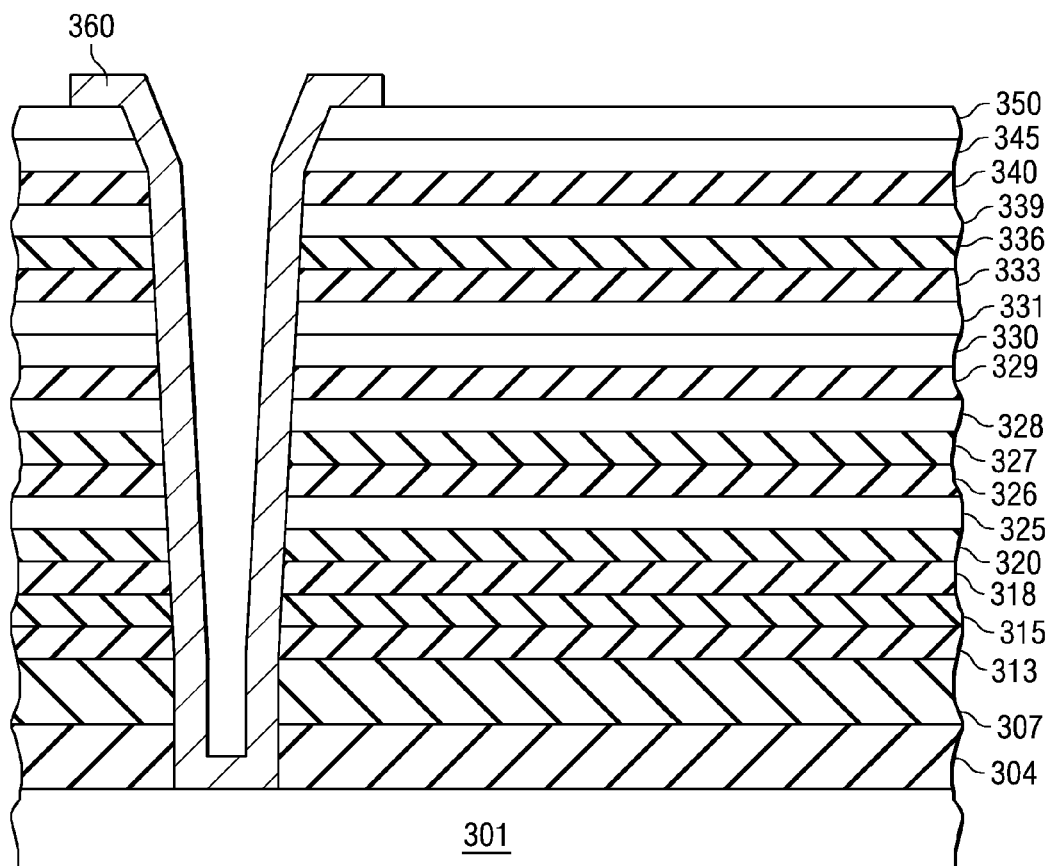

Turning now to FIG. 14, the walls of the source via should be sufficiently sloped so that a thin metal layer (generally designated 360) can be deposited on horizontal and semi-horizontal surfaces, preferably by a vacuum evaporation and deposition process. The metal material is anisotropically deposited onto the horizontal surfaces such as the bottom of the source via and on the sloped surfaces. Typically, about 3000-4000 Å of gold ("Au"), germanium ("Ge"), nickel ("Ni"), and then gold are preferably sequentially deposited and annealed to produce an alloy with a low-resistance ohmic contact and good adhesion with the first, second and third lateral channels 325, 328, 331 and the substrate 301. A low-resistance ohmic contact is also formed with the first buffer layer 304 located above the substrate 301. Other alloys such as palladium-germanium-gold, nickel-indium-germanium, palladium-germanium and aluminum-tin-nickel may be employed to advantage. Annealing causes an alloy to form among the metallic species and allows migration of metal into adjacent semiconductor material forming a metal semiconductor eutectic, thereby enhancing its low-resistance, ohmic property.

Figure 15:
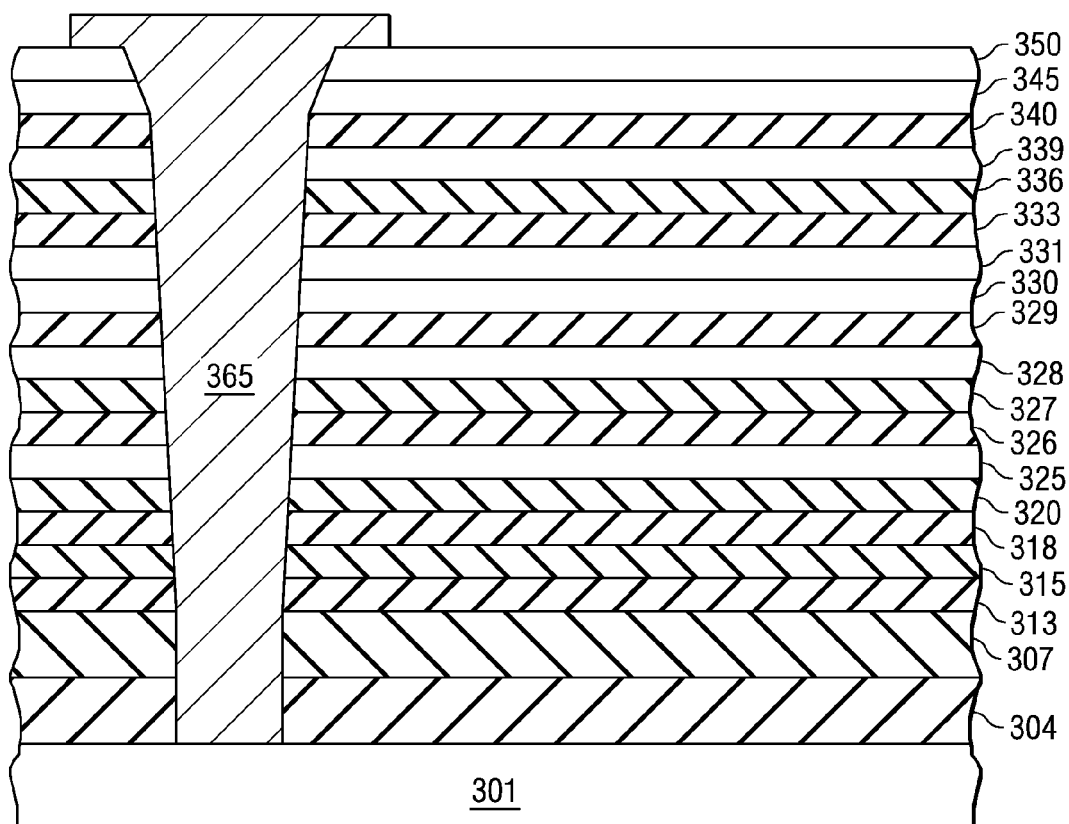

Turning now to FIG. 15, an electroplating process is thereafter performed to form a low-resistance source interconnect 365. The source interconnect 365 is filled with plated platinum and gold. The wafer is dipped into a plating solution and is connected to an electrical current source. A metal material of the plating solution (e.g., either platinum or gold) becomes ionized and is deposited on a conductive surface. The creation of the source interconnect 365 enhances a metallic path between the highly conductive portions of the first, second and third lateral channels 325, 328, 331 and the substrate 301. In this manner, lateral channels 325, 328, 331 between a source contact and a drain contact can be formed and a low-resistance contact to the source (coupled to the lateral channels 325, 328, 331) can be configured on an opposing surface of the substrate driven FET from a contact for the drain (also coupled to the lateral channels 325, 328, 331). Alternatively, an implant may be formed to create the source interconnect such as illustrated in U.S. Patent Application Publication No. 2006/0226477, entitled "Substrate Driven Field-Effect Transistor," to Brar, et al, published Oct. 12, 2006, which is incorporated herein by reference.

Figure 16:
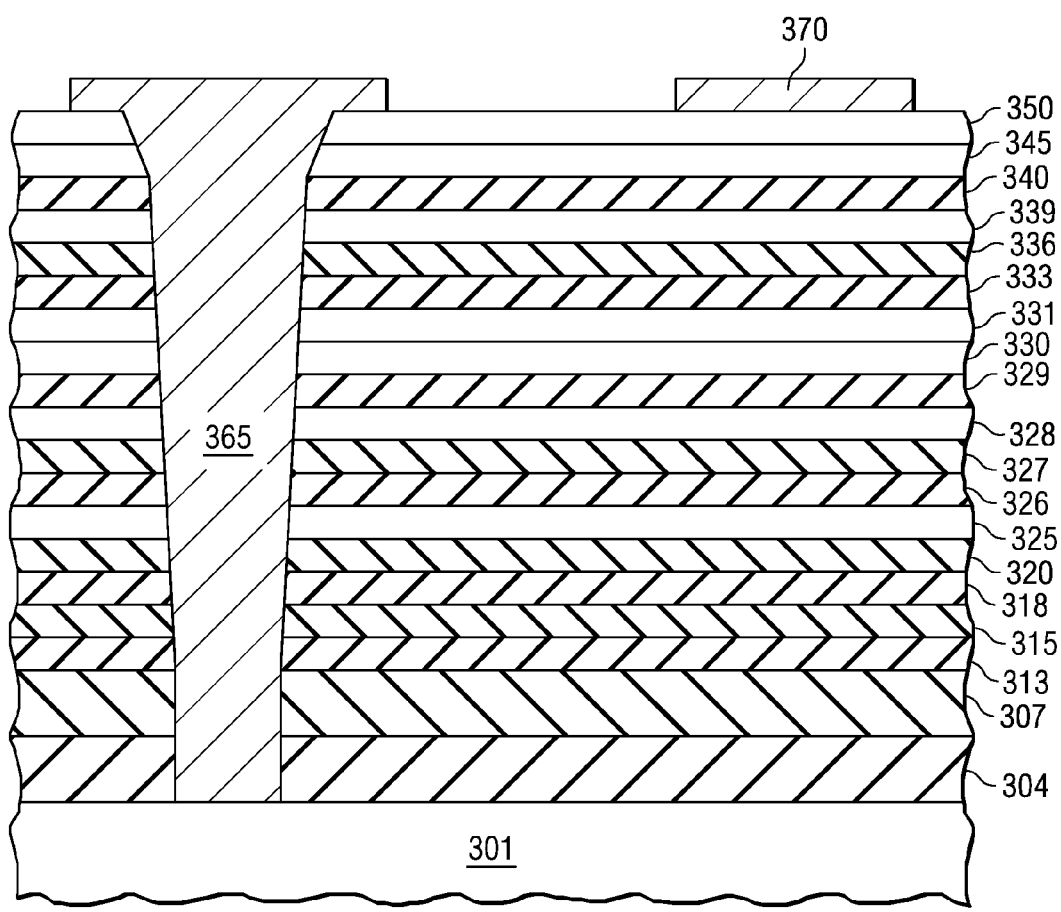

Turning now to FIG. 16, a metal layer 370 is deposited in an area associated with the drain, preferably by a vacuum evaporation and deposition process employing a patterned photoresist. The metal layer 370 provides a low-resistance ohmic contact for the drain. The metal layer 370 also provides a plating base for a process of constructing a drain post as set forth below. Additionally, the metal layer 360 described above and the present metal layer 370 may be deposited at the same time by a technique referred to as a metal lift off process. In such a case, a photoresist is spun on the surface and patterned such that an area where the metal is desired gets exposed and the other areas are covered by the photoresist. Metal evaporation is thereafter performed on the patterned wafer. When the wafer is dipped into solvents, the metal on the top of the patterned photoresist gets removed and only the metal on the exposed area remains. With this process, ohmic contacts may be created at the same time.

Figure 17:
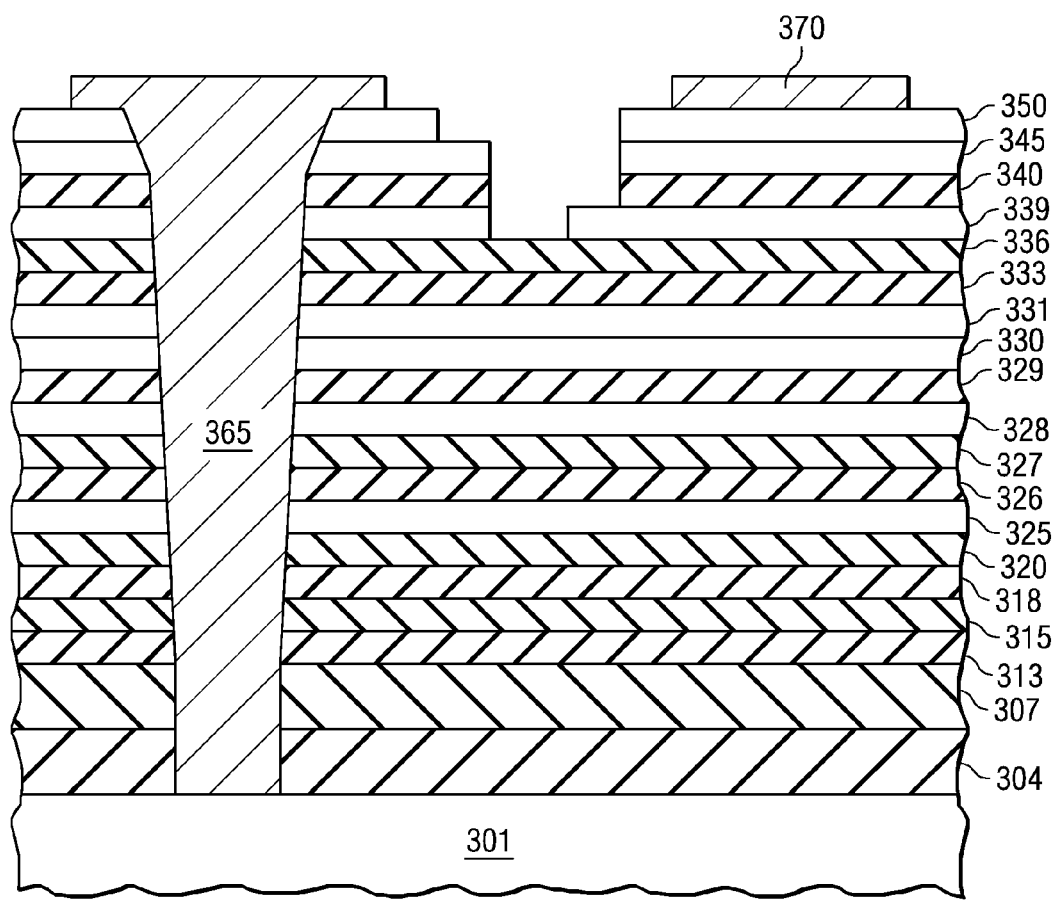

Turning now to FIG. 17, the first and second source/drain contact layers 345, 350 are then patterned and selectively etched to form a wide recess area, preferably in the form of trenches, down to the etch-stop layer 340. The etch-stop layer 340 is etched by a selective wet etch process. A gate recess is thereafter formed by patterning and selectively etching through the recess layer 339 down to the second barrier layer 336. The unetched portion of the recess layer 339 between a gate and drain allows the substrate driven FET to sustain a higher voltage (e.g., 20 volts) by reducing a high internal electric field that would otherwise damage or destroy the device. An appropriate etchant or etchants are used for the selective removal of the respective layers as is well understood in the art.

Figure 18:
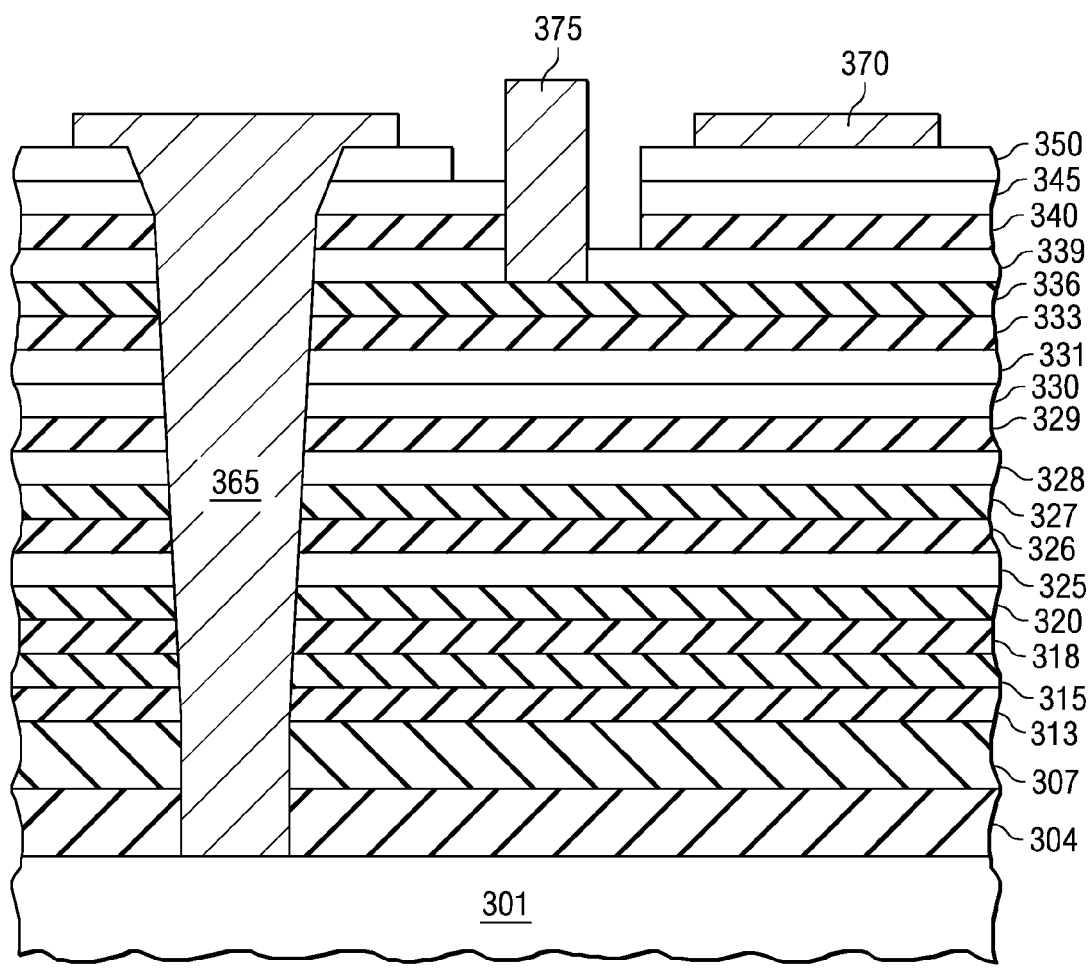
Figure 19:
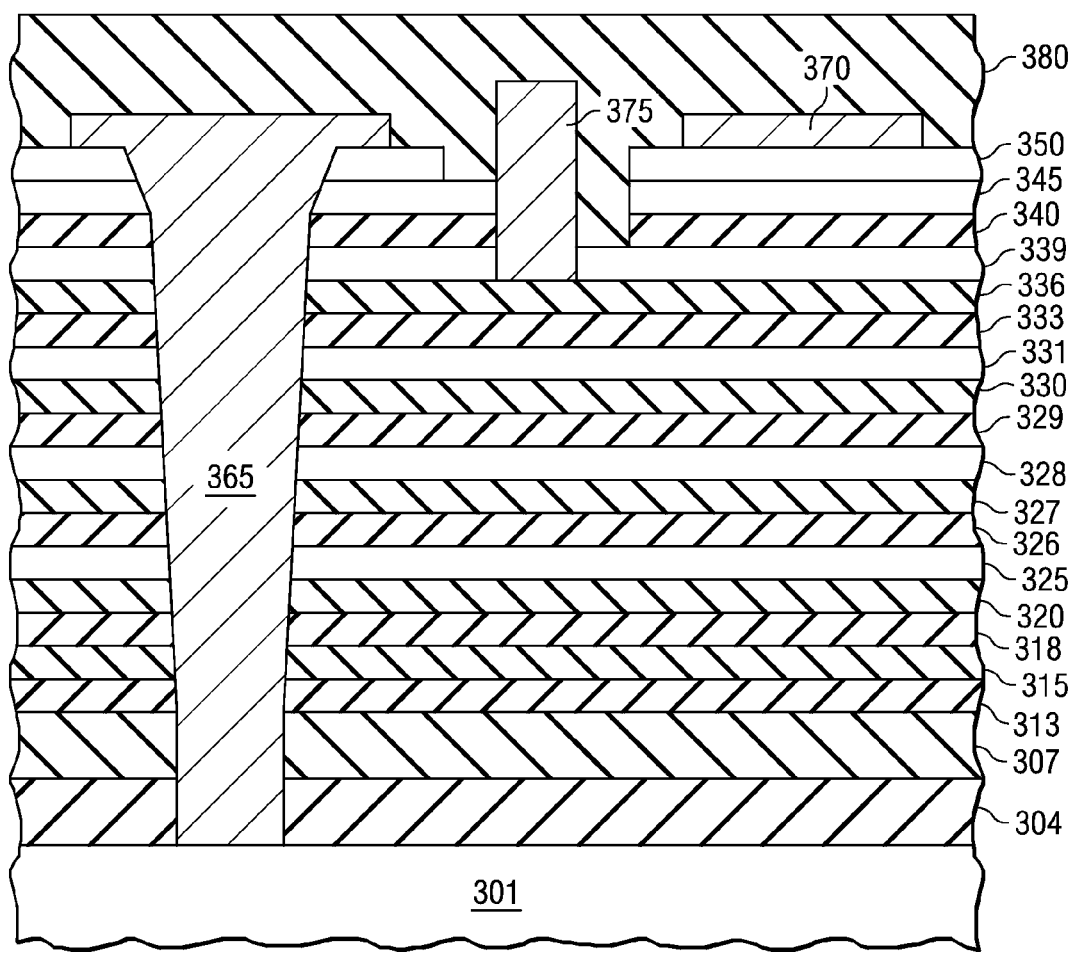

Turning now to FIGS. 18 and 19, a gate 375 is patterned and formed preferably by a self-aligned process in the gate recess. The gate 375 forms a Schottky junction and is formed with multiple layers, preferably metallic multi-layer titanium-platinum-gold ("TiPtAu"), but other Schottky junction forming layers such as titanium-tungsten ("TiW"), tantalum-nitrogen ("TaN"), and tungsten-silicon ("WSi") can also be used within the scope of the present invention. Also, a thin layer providing dielectric surface passivation such as silicon nitride ("$Si_3N_4$", not shown) may then be optionally deposited on an upper surface of the substrate driven FET. A dielectric layer 380 is then formed about the substrate driven FET, preferably with a low dielectric constant material (e.g., BCB, polyimide, Si glass, or other flowable oxide) to preserve a performance of the substrate driven FET. The dielectric layer 380 is typically spun on and cured as necessary for planarization and for further surface passivation. The thickness of the dielectric layer 380 can be controlled by a spinning speed and duration. The cured dielectric layer 380 is strong enough to provide mechanical and chemical support for subsequent processing steps.

Figure 20:
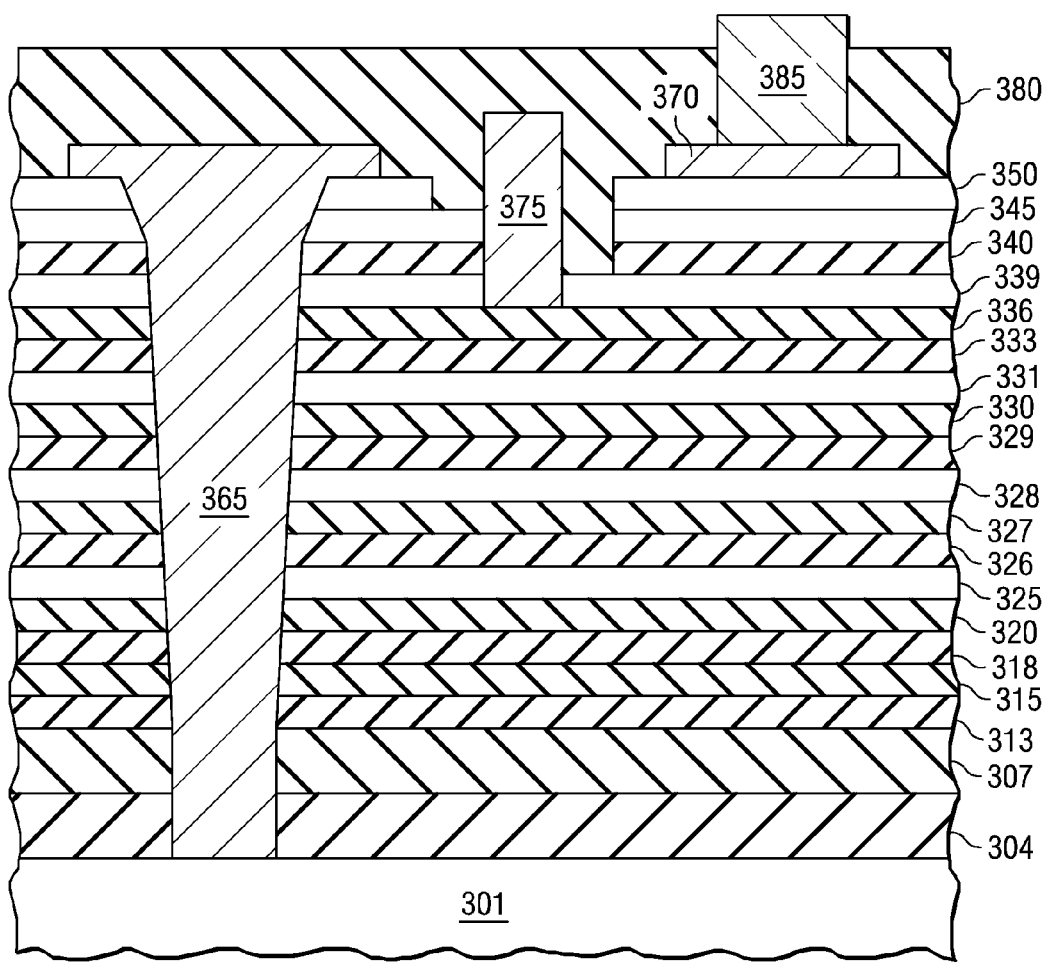

Turning now to FIG. 20, the dielectric layer 380 is then patterned and etched down to the metal layer 370 to form a drain via. An electroplating process is thereafter performed to form a drain post or finger 385. Analogous to the process for creating the source interconnect 365, the wafer is dipped into a gold plating solution and ionized gold elements are deposited on an electrical conductive surface. The drain post 385 is a metallic interconnect that forms a wide area, low-resistance interconnect to a top surface of the substrate driven FET. The alternative is to plate the drain post 385 first, apply the dielectric material 380 and etch the dielectric layer 380 down to the top of the drain post 385 using an etch back technique. In addition, this metal interconnect can be formed by metal evaporation and subsequent lift-off process.

Figure 21:
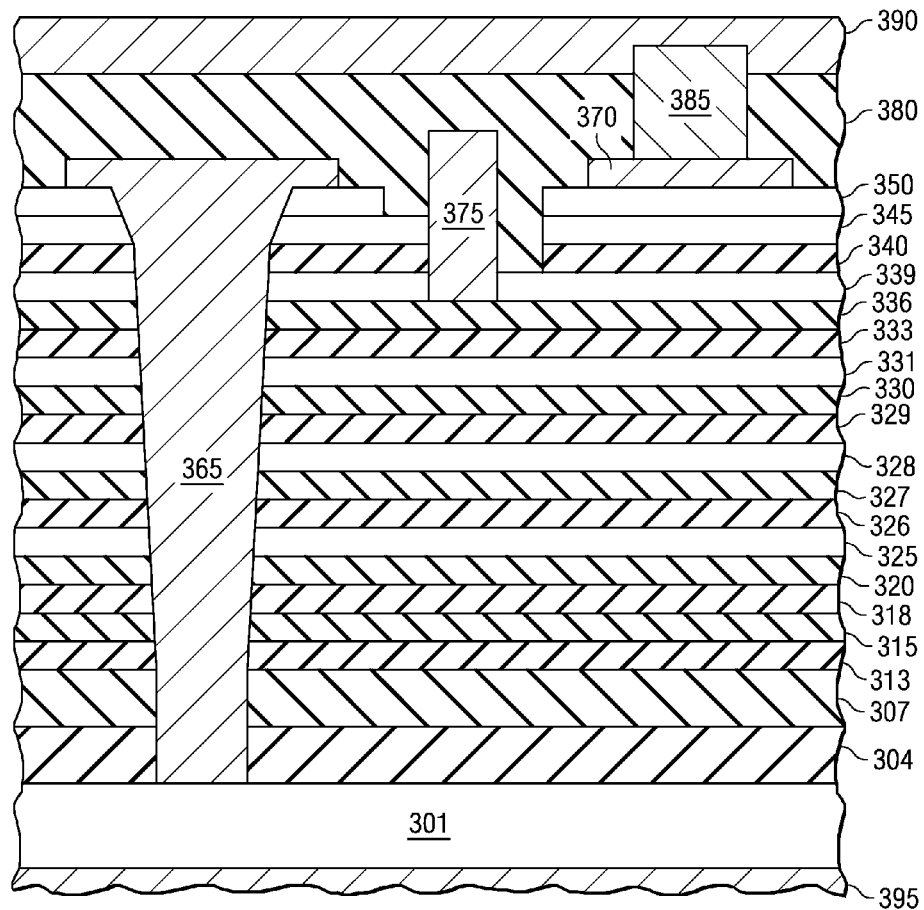

Turning now to FIG. 21, metallized top and bottom contacts (also referred to as drain and source contacts 390, 395, respectively) coupled to the drain post 385 and substrate 301, respectively, are sequentially deposited and preferably patterned on opposing surfaces (i.e., the top and bottom surfaces, respectively) of the substrate driven FET, preferably using a metallic alloy such as titanium-platinum-gold for the top contact and gold-germanium-nickel-gold ("AuGeNiAu") for the bottom contact to form a wide-area, low-resistance, and ohmic junction with the heavily doped n-type GaAs substrate. Prior to creating the source contact 395, the substrate 301 may be ground and polished down to reduce an electrical and thermal resistance. The deposition process may be performed by vacuum deposition, sputtering, plating processes or combinations thereof. The drain and source contacts 390, 395 are typically a few microns in thickness to accommodate the packaging process including die attachment and bonding and cover a substantial portion of a top surface of the substrate driven FET and a bottom surface of the substrate 301 (and, thus, the substrate driven FET), respectively.

As previously mentioned, the isolation layer 307 forms a pair of back-to-back diodes with the buffer layer 304 and the n doped layers thereabove. For instance, an intrinsic body diode is formed with the isolation layer 307 acting as an anode and the first barrier layer 318 and other n-type layers above such as the first and second source/drain contact layers 345, 350 acting as the cathode. The intrinsic body diode provides a conductive path between the source and drain contacts 390, 395 of the substrate driven FET. While the back-to-back diodes are formed with an n-p-n structure in the illustrated embodiment, those skilled in the art should understand that other diode structures are well within the broad scope of the present invention.

Figure 22:
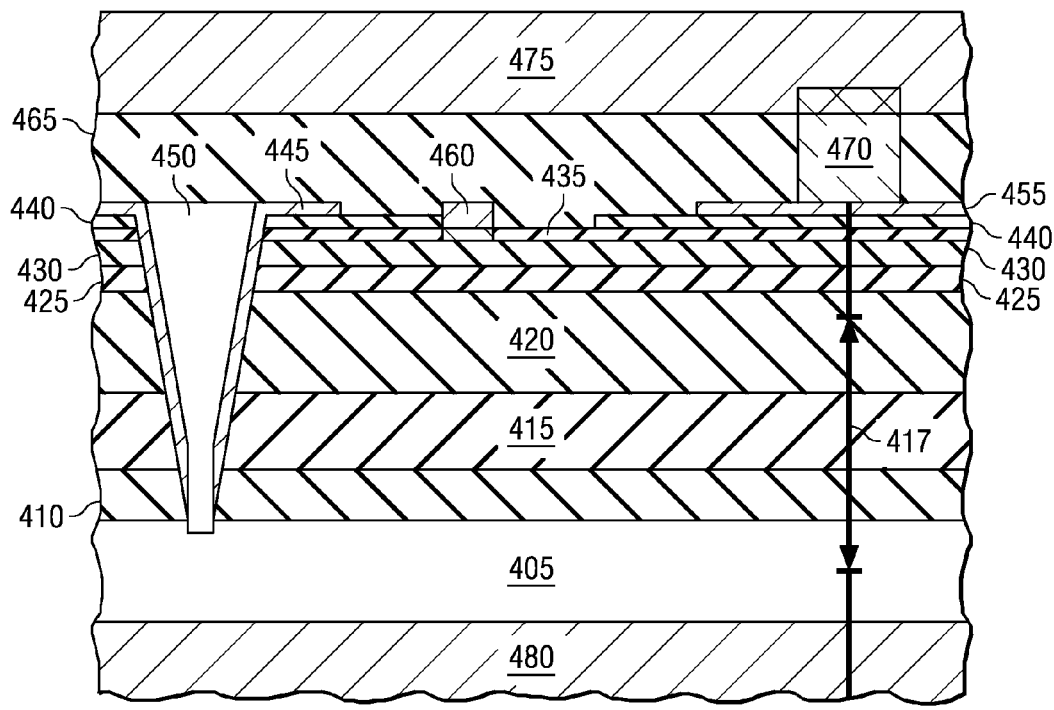
FIGS. 22 and 23 illustrate cross sectional and perspective views, respectively, of another embodiment of a semiconductor device constructed according to the principles of the present invention.
Figure 23:
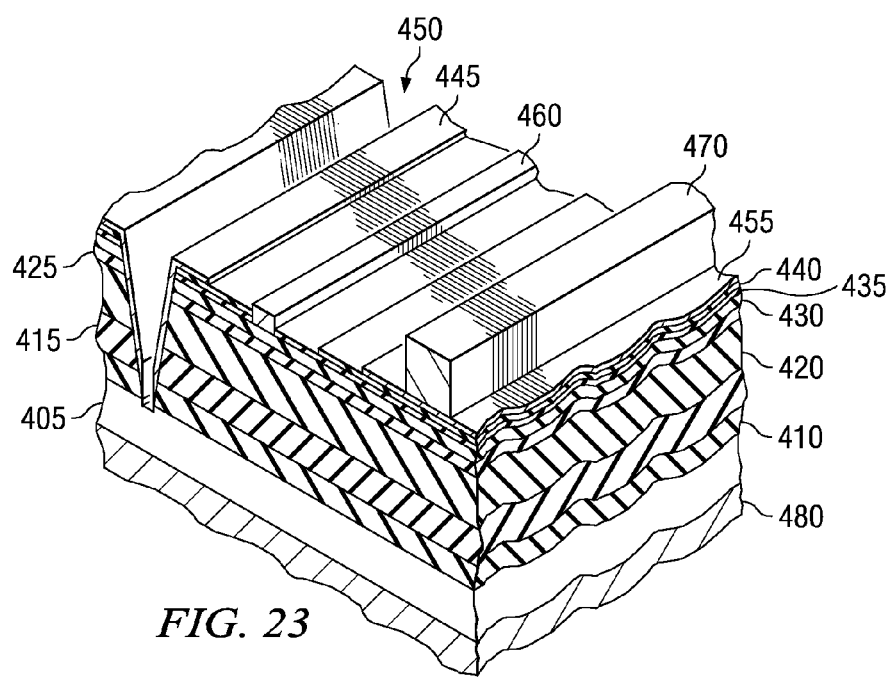

Turning now to FIGS. 22 and 23, illustrated are cross sectional and perspective views of another embodiment of a semiconductor device (e.g., substrate driven FET) constructed according to the principles of the present invention. The substrate driven FET includes a buffer layer 410 overlying a highly conductive gallium arsenide substrate 405. Above the buffer layer 410 is a p-doped isolation layer 415 that is epitaxially grown and formed sufficiently thin to prevent substantial recombination of minority carriers that might be injected therein during certain modes of operation of the substrate driven FET.

The isolation layer 415 forms a pair of back-to-back diodes (generally designated 417 in FIG. 22) at least in part with a region 420 formed thereabove and the buffer layer 410 (both of which include layers or portions thereof that are doped n-type) to substantially block current flow when the substrate driven FET is in a non-conducting state, particularly when a positive voltage is applied between the drain and source contacts thereof. The pair of back-to-back diodes differ from structures that dedicate active die area to build such a structure as illustrated in U.S. Pat. No. 5,956,578 entitled "Method of Fabricating Vertical FET with Schottky Diode," by Weitzel, et al., issued on Sep. 21, 1999, and U.S. Pat. No. 6,097, 046 entitled "Vertical Field Effect Transistor and Diode," by Plumton, issued on Aug. 1, 2000, which are incorporated herein by reference. The aforementioned references employ structures that increase cost or resistance of the channel because active die area is taken away from the field-effect transistor for use by the diodes.

In short, the principles of the present invention create the back-to-back diodes without a separate structure that takes up additional die area or additional footprint beyond the structure of the field-effect transistor. To accommodate the intrinsic body diodes, special attention as described herein should be given to the design of the isolation layer 415 and the layers thereabout. Above the region 420 is a lateral channel region 425 made up of at least two lateral channels. The lateral channels are thin, substantially undoped indium-gallium arsenide ("InGaAs") layers that are epitaxially deposited with about 20% indium to form lateral channels with controllable conductivity. For a better understanding of an exemplary embodiment of the lateral channels see the description above with respect to FIG. 3, et seq.

Above the lateral channel region 425 is another region 430 that is epitaxially deposited including sub-layers of AlGaAsP (0.24 Al and 0.05 P) to provide additional free carriers (electrons) for modulation doping of the lateral channel region 425, and to provide a barrier for the carriers in the lateral channel region 425. An etch-stop layer 435 embodied in a thin, doped AlAs epitaxial deposition is formed above the region 430. Layers of GaAs are epitaxially deposited above the etch-stop layer 435 to form source and drain contact layers 440 for the substrate driven FET.

A source via (or trench) through the layers of the substrate driven FET down to the substrate 405 is provided to create a low-resistance contact between the lateral channel region 425 and the substrate 405. The walls of the source via are sufficiently sloped so that a thin metal layer (generally designated 445) can be deposited on horizontal and semi-horizontal surfaces, preferably by a vacuum evaporation and deposition process. An electroplating process is thereafter performed to form a low-resistance source interconnect 450. A metal layer 455 is also provided to form a low-resistance ohmic contact for the drain. A gate 460 is thereafter patterned and formed preferably by a self-aligned process in a gate recess in the substrate driven FET.

A dielectric layer 465 is then formed about the substrate driven FET, preferably with a low dielectric constant material (e.g., BCB, polyimide, Si glass, or other flowable oxide) to preserve a performance of the substrate driven FET and to provide mechanical support for a drain contact thereabove. The dielectric layer 465 is then patterned and etched down to the metal layer 455 to form a drain via. An electroplating process is thereafter performed to form a drain post 470. Metallized top and bottom contacts (also referred to as drain and source contacts 475, 480, respectively) coupled to the drain post 470 and a bottom surface of the substrate 405, respectively, are sequentially deposited and preferably patterned on the top and bottom surfaces, respectively, of the substrate driven FET. As described with respect to the embodiment of the substrate driven FET above, selected layers of the substrate driven FET may include multiple sub-layers therein to further delineate respective features of the device.

Figure 24:
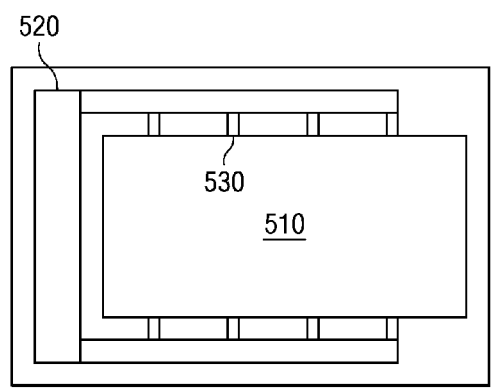
FIG. 24 illustrates a plan view of another embodiment of a semiconductor device constructed according to the principles of the present invention.

Turning now to FIG. 24, illustrated is a plan view of another embodiment of a semiconductor device (e.g., substrate driven FET) constructed according to the principles of the present invention. A drain contact 510 of the substrate driven FET provides a wide area surface covering a substantial portion of the die area, enabling a low-resistance contact to the drain. A gate contact 520 with gate extensions 530 contacts a gate of the substrate driven FET. The couplings (not shown) between the gate extensions 530 on a top surface of the die and the gate are made by plated vias through a dielectric layer using well understood masking, patterning, etching and deposition processes. For a more detailed explanation of an embodiment of the drain contact 510, gate, and dielectric layer, see the description of the substrate driven FET as provided with respect to FIG. 3, et seq. A metallized source contact (not shown) preferably covers an area of the opposing die surface. Thus, the substrate driven FET with reduced area and low on-resistance is enabled by the device structure and methods of the present invention.

Figure 25:
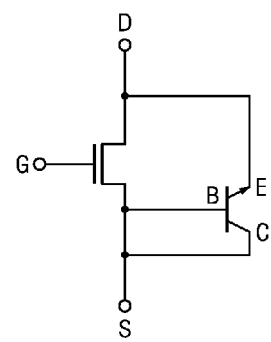
FIG. 25 illustrates an equivalent circuit diagram of a semiconductor device constructed according to the principles of the present invention.

Turning now to FIG. 25, illustrated is an equivalent circuit diagram of a semiconductor device (e.g., substrate-driven FET) constructed according to the principles of the present invention. As described above, the substrate-driven FET is formed on a conductive substrate and includes a drain contact D, gate contact G and a source contact S. An n-p-n bipolar transistor (i.e., back-to-back diodes) is formed within the structure of the substrate-driven FET and includes an emitter E, a base B and a collector C. The base B and collector C of the n-p-n bipolar transistor are coupled to a source interconnect and source contact therefrom, which provides a short circuit across the base B and collector C. As a result, an intrinsic body diode is formed by the emitter-base junction of the n-p-n bipolar transistor in parallel with the source and drain of the substrate-driven FET. Thus, an intrinsic body diode is formed within the substrate-driven FET with a cathode coupled to the drain contact D, and an anode coupled to the source contact S. Of course, oppositely doped semiconductor processes can be used to form the substrate-driven FET, with corresponding changes to the emitter, base, and collector of the bipolar transistor.

The substrate driven FET as described above is readily operable as a depletion-mode FET. In other words, the channels are enabled to conduct when substantially zero volts is applied between the gate and source contacts thereof (i.e., for "substantially zero gate voltage"). A depletion-mode device is ordinarily expected to be pinched off with negative gate voltage, relying on the current-blocking character of a gate for negative applied voltage. If the gate voltage is raised above about 0.8 volts positive to further enhance the channel conductivity, then gate current is expected to flow. A modest gate current is not harmful to the operation of the substrate driven FET, and thus the device is ordinarily capable of operation with gate voltage less than about 0.8 volts, or at higher gate voltage with suitable provision to limit the gate current. Exemplary circuits employing depletion mode devices are illustrated and described in U.S. Patent Application Publication No. 2006/0198173, entitled "Control Circuit for a Depletion Mode Switch and Method of Operating the Same," to Rozman, published Sep. 7, 2006, which is incorporated herein by reference.

An enhancement-mode device can be produced or provided by several alternatives to the processing steps described hereinabove. For purposes of illustration, any modifications to the processing steps to attain an enhancement-mode device will be described with reference to the substrate driven FET illustrated and described with respect to FIGS. 3 to 21 above. One alternative is to reduce the top delta doping level to a selected level of about $1 \times 10^{12}$ cm$^{-2}$ instead of $4 \times 10^{12}$ cm$^{-2}$, which reduces the level of the free carriers in the lateral channels that can be used to increase channel resistance several orders of magnitude higher than a depletion-mode design with substantially zero gate voltage. It may not be necessary in practical circuit designs for the substrate driven FET to provide essentially an open circuit when the gate voltage is substantially zero. A careful engineering assessment of the proper doping levels for the layers should be made to determine the best trade-off of channel resistance for substantially zero gate voltage and the resulting on-resistance of the device for a positive gate voltage. The reduction of free carriers in the portion of the lateral channels outside the region of the gate resulting from reduced pulse doping may raise the on-resistance of the substrate driven FET. This effect can be reduced by selectively implanting the lateral channels with an n-type dopant in regions away from the gate.

Another alternative to preserve low on-resistance of an enhancement-mode device is to recess the gate through the gate recess closer to or proximate the lateral channels and provide higher pulse doping levels. An etch-stop layer may be selectively formed under the gate to facilitate this option. This approach relies on the recessed gate metal forming a sufficiently deep depletion region in the lateral channels to provide the necessary device resistance for substantially zero gate voltage.

The substrate driven FET as described above includes an intrinsic body diode with its anode coupled to the source, and cathode to the drain. When the substrate driven FET is conducting, a positive current normally flows from source to drain through the lateral channels. When the lateral channels are not conducting and a negative potential is applied to the drain contact, an ohmic contact between the source interconnect and the buffer and isolation layers couples the respective layers together. The resistance of this ohmic contact can be adjusted by selecting a suitably high doping level for the isolation layer, thus providing an anode connection to the source for the intrinsic body diode. The n-doped layers above (such as the spacer layer above the lateral channels) provide the cathode, and are substantially coupled to the drain.

Another mechanism for conduction through an intrinsic body diode relies on the isolation layer being sufficiently thin that electrons can diffuse therethrough, enabling conduction through a parasitic n-p-n bipolar transistor formed by the substrate and the buffer layer (the collector), the isolation layer (the base), and overlying n-type layers such as the first and second source/drain contact layers (the emitter). If the thickness of the isolation layer is increased to be greater than the 1000 Å as previously described (preferably in the range of 5000 Å), then electron recombination in the isolation layer will be a dominant effect, and electrons injected from the drain will not successfully diffuse to the substrate. Conduction will occur laterally through the isolation layer to the metallized source contact. Competition between these two mechanisms for operation of the intrinsic body diode can occur, with the dominant effect depending on the thickness and doping of the isolation layer. A forward voltage drop of approximately 1.5 volts is expected for this diode. Localized implant doping to increase the doping level of the isolation layer in a region about the metallized source interconnect can be used to enhance the diode performance.

Thus, a substrate-driven FET configured with switched contacts on opposing surfaces, an intrinsic body diode and lateral channels that may be modulation doped has been introduced. The substrate driven FET can be configured as a depletion-mode or as an enhancement-mode device. The resulting substrate driven FET can be designed and packaged to exhibit very low on-resistance and be operable with very fast switching speeds. While the illustrated embodiments introduce a source contact coupled to a bottom surface of a substrate and a drain contact on a top surface of the substrate driven FET, those skilled in the art understand that the contacts may be reversed and still fall within the broad scope of the present invention.

Those skilled in the art should understand that the previously described embodiments of the field-effect transistor and related methods of forming the same are submitted for illustrative purposes only. In addition, other embodiments capable of providing the advantages as described above are well within the broad scope of the present invention. While the field-effect transistor has been described as providing advantages in the environment of a power supply, other applications therefor are well within the broad scope of the present invention.

For a better understanding of power electronics, see "Principles of Power Electronics," by J. G. Kassakian, M. F. Schlecht and G. C. Verghese, Addison-Wesley (1991). For a better understanding of semiconductor devices and processes, see "Fundamentals of III-V Devices," by William Liu, John Wiley and Sons, (1999). For a better understanding of gallium arsenide processing, see "Modern GaAs Processing Methods," by Ralph Williams, Artech House, Second Ed. (1990). The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof, to form the devices providing reduced on-resistance, gate drive energy, and costs as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. Additionally, the terms "above," "formed over" or other similar terminology employed in reference to the semiconductor device or method of forming the same shall not be limited to "directly above" or "directly formed over" and, unless otherwise specified, the scope of the present invention contemplates that intervening layers may be present when characterizing a layer above, over, formed over, etc., another layer.

What is claimed is:

1. A semiconductor device, comprising:
   a conductive substrate having a first contact covering a substantial portion of a bottom surface thereof;
   a first lateral channel above said conductive substrate;
   a second lateral channel above said first lateral channel;
   a second contact above said second lateral channel; and
   an interconnect that connects said first and second lateral channels to said conductive substrate operable to provide a low resistance coupling between said first contact and said first and second lateral channels.

2. The semiconductor device as recited in claim 1 further comprising a buffer layer interposed between said conductive substrate and said first lateral channel.

3. The semiconductor device as recited in claim 1 further comprising an isolation layer interposed between said conductive substrate and said first lateral channel.

4. The semiconductor device as recited in claim 1 further comprising a spacer layer interposed between said conductive substrate and said first lateral channel.

5. The semiconductor device as recited in claim 1 further comprising a barrier layer interposed between said conductive substrate and said first lateral channel.

6. The semiconductor device as recited in claim 1 further comprising a barrier layer interposed between said second lateral channel and said second contact.

7. The semiconductor device as recited in claim 1 further comprising a modulation doped spacer layer interposed between said first and second lateral channels.

8. The semiconductor device as recited in claim 1 further comprising a recess layer interposed between said second lateral channel and said second contact.

9. The semiconductor device as recited in claim 1 further comprising an etch-stop layer interposed between said second lateral channel and said second contact.

10. The semiconductor device as recited in claim 1 further comprising first and second source/drain contact layers interposed between said second lateral channel and said second contact.

11. The semiconductor device as recited in claim 1 further comprising a gate located in a gate recess interposed between said second lateral channel and said second contact.

12. The semiconductor device as recited in claim 1 further comprising a Dielectric layer interposed between said second lateral channel and said second contact.

13. The semiconductor device as recited in claim 1 further comprising a drain post interposed between said second lateral channel and said second contact.

14. The semiconductor device as recited in claim 1 wherein said conductive substrate is formed from gallium arsenide.

15. The semiconductor device as recited in claim 1 further comprising an isolation layer and a barrier layer interposed between said conductive substrate and said second contact configured at least in part to form an intrinsic body diode within said semiconductor device.

16. The semiconductor device as recited in claim 1 further comprising a buffer layer formed of an alternating aluminum-gallium arsenide/gallium arsenide ("AlGaAs/GaAs") superlattice buffer interposed between said conductive substrate and said first lateral channel.

17. The semiconductor device as recited in claim 1 further comprising a modulation doped barrier layer formed from aluminum gallium-arsenide ("AlGaAs") interposed between said conductive substrate and said first lateral channel.

18. The semiconductor device as recited in claim 1 further comprising a buffer layer, an isolation layer and a barrier layer interposed between said conductive substrate and said first lateral channel configured to form at least in part back-to-back diodes within said semiconductor device.

19. The semiconductor device as recited in claim 1 wherein said first and second lateral channels are formed from indium gallium arsenide.

20. The semiconductor device as recited in claim 1 wherein said first and second lateral channels are pseudomorphic.

21. The semiconductor device as recited in claim 1 wherein said interconnect is located in a via formed through said semiconductor device down to said conductive substrate.

22. The semiconductor device as recited in claim 1 wherein said interconnect has a metal layer on horizontal and semi-horizontal surfaces thereof and is plated with a metal material.

23. The semiconductor device as recited in claim 1 wherein said semiconductor device is a depletion mode device.

24. The semiconductor device as recited in claim 1 wherein said semiconductor device is an enhancement mode device.

25. The semiconductor device as recited in claim 1 further comprising a gate located in a gate recess located in said semiconductor device proximate said second lateral channel thereby providing an enhancement mode device.

26. A semiconductor device, comprising:
a conductive substrate having a first contact covering a substantial portion of a bottom surface thereof;
a first lateral channel above said conductive substrate;
a second lateral channel above said first lateral channel;
a second contact above said second lateral channel;
an interconnect that connects said first and second lateral channels to said conductive substrate operable to provide a low resistance coupling between said first contact and said first and second lateral channels; and
an intrinsic body diode operable to provide a conductive path between said first and second contacts.

27. The semiconductor device as recited in claim 26 wherein said intrinsic body diode is formed at least in part by an isolation layer and a barrier layer above said conductive substrate.

28. The semiconductor device as recited in claim 26 further comprising a spacer layer and a barrier layer interposed between said conductive substrate and said first lateral channel.

29. The semiconductor device as recited in claim 26 further comprising a modulation doped spacer layer and a barrier layer interposed between said second lateral channels and said second contact.

30. The semiconductor device as recited in claim 26 further comprising a recess layer, an etch-stop layer and first and second source/drain contact layers interposed between said second lateral channel and said second contact.

31. The semiconductor device as recited in claim 26 further comprising a gate located in a gate recess interposed between said second lateral channel and said second contact.

32. The semiconductor device as recited in claim 26 further comprising a drain post interposed between said second lateral channel and said second contact.

33. The semiconductor device as recited in claim 26 further comprising a buffer layer formed of an alternating aluminum-gallium arsenide/gallium arsenide ("AlGaAs/GaAs") superlattice buffer interposed between said conductive substrate and said first lateral channel.

34. The semiconductor device as recited in claim 26 further comprising a modulation doped barrier layer formed from aluminum gallium-arsenide ("AlGaAs") interposed between said conductive substrate and said first lateral channel.

35. The semiconductor device as recited in claim 26 further comprising a buffer layer, an isolation layer and a barrier layer interposed between said conductive substrate and said first lateral channel configured to form at least in part back-to-back diodes within said semiconductor device.

36. The semiconductor device as recited in claim 26 wherein said first and second lateral channels are pseudomorphic.

37. The semiconductor device as recited in claim 26 wherein said interconnect is located in a via formed through said semiconductor device down to said conductive substrate, said interconnect having a metal layer on horizontal and semi-horizontal surfaces thereof and being plated with a metal material.

38. The semiconductor device as recited in claim 26 wherein said semiconductor device is a depletion mode device.

39. The semiconductor device as recited in claim 26 wherein said semiconductor device is an enhancement mode device.

40. The semiconductor device as recited in claim 26 further comprising a gate located in a gate recess located in said semiconductor device proximate said second lateral channel thereby providing an enhancement mode device.

* * * * *